(12) United States Patent
Morikawa et al.

(10) Patent No.: US 6,666,987 B1
(45) Date of Patent: Dec. 23, 2003

(54) LIQUID ETCHANT AND METHOD FOR ROUGHENING COPPER SURFACE

(75) Inventors: Yoshihiko Morikawa, Kanagawa (JP); Kazunori Senbiki, Kanagawa (JP); Nobuhiro Yamazaki, Kanagawa (JP)

(73) Assignee: Ebara Densan Ltd. (JP)

( * ) Notice: Subject to any disclaimer, the term of this patent is extended or adjusted under 35 U.S.C. 154(b) by 0 days.

(21) Appl. No.: 09/327,800

(22) Filed: Jun. 8, 1999

(30) Foreign Application Priority Data

Jun. 9, 1998 (JP) .......................................... 10-160136
Apr. 2, 1999 (JP) .......................................... 11-096194

(51) Int. Cl.$^7$ ............................................. C09K 13/06
(52) U.S. Cl. .................... 252/79.4; 252/79.1; 252/79.2; 252/79.3; 510/295; 510/367; 510/375; 216/96; 216/100; 216/103; 216/105; 216/106; 216/107; 134/2; 134/3
(58) Field of Search .................. 216/105, 106, 216/107, 96, 100, 103; 510/369, 102, 103, 245, 367, 375; 252/79.1, 79.2, 79.3, 79.4; 134/2, 3

(56) References Cited

U.S. PATENT DOCUMENTS

| 3,948,703 A | 4/1976 | Kushibe ....................... 156/20 |
| 5,532,094 A | 7/1996 | Arimura et al. ........... 252/79.1 |

FOREIGN PATENT DOCUMENTS

| DE | 197 32 419 A1 | 2/1998 |
| EP | 0 620 293 A1 | 10/1994 |
| EP | 0 890 660 A1 | 1/1999 |
| GB | 2 106 086 A | 4/1983 |
| WO | WO 96/19097 | 6/1996 |

OTHER PUBLICATIONS

Abstract of Japan Publication No. 6–192855.
Abstract of Japan Publication No. 6–179984.
Abstract of Japan Publication No. 51–27819.
Abstract of Japan Publication No. 53–32341.
Abstract of Japan Publication No. 11–29883.
Abstract of Japan Publication No. 10096088 A.
Abstract of Japan Publication No. 09041162 A.

*Primary Examiner*—Randy Gulakowski
*Assistant Examiner*—M. Kornakov
(74) *Attorney, Agent, or Firm*—Lerner, David, Littenberg, Krumholz & Mentlik, LLP

(57) ABSTRACT

A liquid etchant and a method for roughening a copper surface each capable of providing copper with a roughened surface increased in acid resistance regardless of a chlorine ion in a short period of time, to thereby ensure firm adhesion between a copper conductive pattern and an outer layer material during manufacturing of a printed circuit board, resulting in the manufacturing being highly simplified. The liquid etchant includes a main component containing an oxo acid such as sulfuric acid and a peroxide such as hydrogen peroxide. Also, the liquid etchant includes an auxiliary component containing a tetrazole such as 5-aminotetrazole or the like, or a 1,2,3-azole. The liquid etchant permits a copper surface to be roughened in an acicular manner.

28 Claims, 16 Drawing Sheets

LIQUID ETCHANT AND METHOD FOR ROUGHENING COPPER SURFACE

BACKGROUND OF THE INVENTION

This invention relates to a liquid etchant used for etching of a copper foil or a copper plate and a method for etchant for acicularly roughening a surface of copper and a method for etching a surface of copper to roughen the surface.

A multi-layer printed board is typically constructed by laminating an inner layer material, an outer layer material and prepregs on each other. In general, manufacturing of such a raw multi-layer printed board thus constructed is carried out by roughening a surface of a copper conductive pattern layer of the inner layer material and then laminating the outer layer material made of resin, a film, an ink or the like on the roughened conductive pattern of the inner layer material to prepare a laminate. Then, the laminate is formed with through-holes and then subjected to electro-plating.

Roughening of the copper conductive pattern layer is conventionally carried out according to any one of three methods. A first method is to form a layer of oxide such as cuprous oxide or cupric oxide on the surface of the copper conductive pattern layer. A second method is to reduce such an oxide layer to copper metal while keeping a shape of the oxide layer unchanged. A third method is to form a metallic copper layer increased in particle diameter on the surface of the copper conductive pattern layer by electroless copper plating.

Unfortunately, the first method, when copper oxide exposed on an inner surface of each of the through-holes is immersed or dipped in an acidic liquid such as a plating solution, causes the exposed copper oxide to be dissolved in the acidic liquid, leading to a defect called a pink ring. The second method requires to use an expensive reducing agent after formation of the oxide, to thereby cause not only an increase in number of steps in the manufacturing but an increase in manufacturing cost. Also, the third method likewise causes an increase in number of steps in the manufacturing.

In view of the foregoing, the assignee proposed etching techniques of subjecting a surface of copper to etching using an liquid etchant containing an oxo acid, an azole (in particular, benzotriazole) and a halide, as disclosed in Japanese Patent Application Laid-Open Publication No. 96088/1998. The proposed techniques permit a copper conductive pattern to be provided with a roughened surface increased in acid resistance while keeping the number of steps from being increased, to thereby solve the problems encountered by the first to third methods described above.

However, the proposed techniques necessarily require to combine benzotriazole with a halide. Also, the halide must be added in an amount of about 100 mg/l, to thereby stabilize a dissolving rate or etching rate of copper. This causes the etching rate to be reduced to a level as low as 0.5 µm/min. Thus, the proposed techniques require a considerable period of time as long as about 4 to 6 minutes for formation of the roughened surface, leading to a failure in exhibiting increased productivity.

More particularly, the proposed techniques cause the etching rate with respect to a chlorine ion concentration to exhibit such characteristics as shown in FIG. 5. The etching rate is drastically increased or varied when the chlorine ion concentration is reduced to a level below 40 mg/l, so that it is highly difficult to keep the etching rate at a constant level. Thus, the proposed techniques require to adjust the chlorine ion concentration at a level of about 100 mg/l in order to stabilize the etching rate. Unfortunately, this leads to a reduction in the etching rate.

SUMMARY OF THE INVENTION

The present invention has been made in view of the foregoing disadvantages of the prior art.

Accordingly, it is an object of the present invention to provide a liquid etchant which is capable of forming a copper conductive pattern layer or the like with a roughened surface increased in acid resistance in a short period of time.

It is another object of the present invention to provide a method for roughening a surface of copper for production of a printed circuit board using such a liquid etchant while keeping the number of steps from being increased.

In accordance with one aspect of the present invention, a liquid etchant is provided. The liquid etchant includes a main component containing at least one acid selected from the group consisting of oxo acids represented by one of the following chemical formulae:

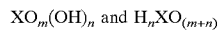

wherein X is a central atom, m is an integer of 0 or more, and n is an integer of 1 or more and derivatives thereof and at least one compound selected from the group consisting of peroxides and derivatives thereof. The central atom X may be S, P, N and the like. Also, the liquid etchant includes an auxiliary component containing at least one tetrazole.

Also, in accordance with this aspect of the present invention, a liquid etchant is provided. The liquid etchant includes a main component containing at least one acid selected from the group consisting of oxo acids represented by one of the following chemical formulae:

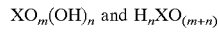

wherein X is a central atom, m is an integer of 0 or more, and n is an integer of 1 or more and derivatives thereof and at least one compound selected from the group consisting of peroxides and derivatives thereof. The central atom X may be S, P, N and the like. Also, the liquid etchant includes an auxiliary component containing at least one azole selected from the group consisting of 1,2,3-azoles which have three or more nitrogen atoms arranged in succession in a five-membered N-heterocycle thereof.

In a preferred embodiment of the present invention, the 1,2,3-azoles are represented by one of the following chemical formulae:

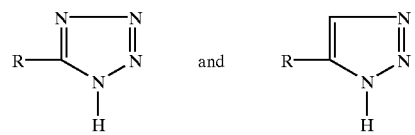

wherein R is selected from the group consisting of hydrogen, methyl, amino, carboxyl, mercapto radicals and the like.

In a preferred embodiment of the present invention, the auxiliary component contains at least one halide selected from the group consisting of chlorides, fluorides and bromides. The halide may be a chloride which is contained in the liquid etchant so that a chlorine ion concentration is 50 mg/l or less. Alternatively, the halide may be a fluoride which is contained in the liquid etchant so that a fluorine ion concentration is 50 g/l or less. The halide may also be a bromide which is contained in the liquid etchant so that a bromine ion concentration is 0.1 g/l or less.

In a preferred embodiment of the present invention, the auxiliary component further contains a second azole.

In a preferred embodiment of the present invention, the m in the chemical formulae representing the oxo acids is 2 or more.

In a preferred embodiment of the present invention, the (m+n) in the chemical formulae representing the oxo acids is 4 or more.

In accordance with another aspect of the present invention, a method for roughening a copper surface is provided. The method includes the step of subjecting the copper surface to etching using any one of liquid etchants described above so that the copper surface is provided with acicular projections.

In the present invention, the oxo acids and their derivatives are typically represented by sulfuric acid ($H_2SO_4$). However, they are not limited to sulfuric acid. They may include nitric acid ($HNO_3$), boric acid ($H_3BO_3$), perchloric acid ($HClO_4$), chloric acid ($HClO_3$),phosphoric acid ($H_3PO_4$), 2-hydroxyethane-1-sulfonic acid ($HOC_2H_4SO_3H$), hydroxybenzenesulfonic acid ($HOC_6H_4SO_3H$), methanesulfonic acid ($CH_3SO_3H$), nitrobenzenesulfonic acid ($NO_2C_6H_4SO_3H$), aminosulfonic acid ($NH_2SO_3H$) and the like.

The peroxides are typically represented by hydrogen peroxide ($H_2O_2$), and the peroxide derivatives may include peroxo acids and their salts. Hydrogen peroxide, peroxomono acid or its salt is suitable for this purpose. More specifically, the peroxomono acids include peroxomonosulfuric acid ($H_2SO_5$), peroxochromic acid ($H_3CrO_8$), peroxonitric acid ($HNO_4$), peroxoboric acids ($HBO_3$, $HBO_4$, $HBO_5$), peroxomonophosphoric acid ($H_3PO_5$) and the like. Also, salts of such peroxo acids include potassium peroxomonosulfate ($K_2SO_5$), potassium hydrogenperoxosulfate ($KHSO_5$), sodium peroxochromate ($Na_3CrO_8$), potassium peroxonitrate ($KNO_4$), sodium perborate ($NaBO_3$, $NaBO_4$, NaBO5), sodium peroxomonophosphate ($Na_3PO_5$) and the like.

The tetrazoles typically include 1H-tetrazole, as well as derivatives thereof such as 5-aminotetrazole, 5-methyltetrazole and the like.

The 1,2,3-azoles typically include 1H-tetrazole, as well as derivatives thereof such as 5-amino-1H-tetrazole, 5-methyl-1H-tetrazole and the like. Alternatively, they typically include 1H-triazole, as well as derivatives thereof such as 5-amino-1H-triazole, 5-mercapto-1H-triazole, 5-methyl-1H-triazole and the like.

The azoles used may include oxazole, thiazole, imidazole, pyrazole, benzotriazole, triazole, tetrazole and the like.

The halides may typically include fluoride, chloride and bromide. Hydrofluoric acid, hydrochloric acid, hydrobromic acid and salts thereof may be added in a trace amount to the liquid etchant as required.

In a preferred embodiment of the present invention, when the liquid etchant uses sulfuric acid as the oxo acid, it may be contained or compounded at a concentration of 20 to 300 g/l and more desirably 40 to 200 g/l in the liquid etchant. When 2-hydroxyethane-1-sulfonic acid is used as the oxo acid derivative in the liquid etchant, the liquid etchant may contain 2-hydroxyethane-1-sulfonic acid at a concentration of 30 to 300 g/l and more desirably 50 to 250 g/l. Also, when hydrogen peroxide is used as the peroxide in the liquid etchant, it may be contained at a concentration of 10 to 200 g/l and more desirably to 80 g/l. When potassium peroxomonosulfate is used as the peroxide, it may be contained or compounded at a concentration of 20 to 300 g/l and more desirably 50 to 250 g/l. In addition, the tetrazole may be contained at a concentration of 0.1 to 20 g/l and more desirably 1 to 20 g/l and the 1,2,3-azoles may be contained at a concentration of 0.1 to 20 g/l and more desirably 1 to 20 g/l.

The halide may be added to the liquid etchant as required when later inclusion of halogen is anticipated or expected, resulting in preventing a reduction or variation in an etching rate of the liquid etchant due to the inclusion. The halides include sodium fluoride, sodium chloride, potassium bromide and the like. An etching rate of the liquid etchant is substantially reduced when a fluorine ion is present at a concentration above 50 g/l, a chlorine ion is present at a concentration above 50 mg/l or a bromine ion is present at a concentration above 0.1 g/l; the etching rate is substantially reduced. Thus, addition of the halides to the liquid etchant of the present invention is carried out so as to ensure that concentrations of the fluorine ion, chlorine ion and bromine ion are 50 g/l or less and more desirably 25 g/l or less, 50 mg/l or less and more desirably 20 mg/l or less, and 0.1 g/l or less and more desirably 0.05 g/l or less, respectively.

The auxiliary component may include other azoles in addition to tetrazoles and 1,2,3-azoles, resulting in a combination of a plurality of tetrazoles, a combination of tetrazole and triazole, a combination of a plurality of 1,2,3-azoles, a combination of 1,2,3-azoles and other azoles, and the like by way of example. The first combination may be represented by a combination between 5-aminotetrazole and 5-methyltetrazole, or the like. The second combination may be represented by a combination between 5-aminotetrazole and benzotriazole or tolyltriazole, or the like.

Although the liquid etchant of the present invention constructed as described above is not restricted by any specific theory, it will be considered that it exhibits a function, as follows:

The liquid etchant of the present invention constructed as described above permits the tetrazole or 1,2,3-azole acting as the auxiliary component to form an electron-mediating carrier layer on a surface of copper when the copper is dipped in the liquid etchant. Also, the liquid etchant permits copper ions to selectively elute from crystal defects formed on the copper surface into the liquid etchant, resulting in electrons being discharged into the liquid etchant. The electrons thus discharged are fed through the carrier layer to the peroxide, so that the peroxide may be reduced and water may be produced at an interface of the carrier layer positioned on a side thereof facing the liquid etchant. This permits a concentration gradient of the copper ion to be formed on both sides of the carrier layer wherein the concentration is increased on a side of the carrier layer facing the copper and decreased on a side thereof facing the liquid etchant. This results in an action as a local cell being enhanced, so that copper is eluted selectively from the deepest portion of the copper surface at which the copper ion concentration is highest, to thereby permit irregularities to be formed on the copper surface.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Now, the present invention will be described hereinafter with reference to the accompanying drawings.

Figure 1:
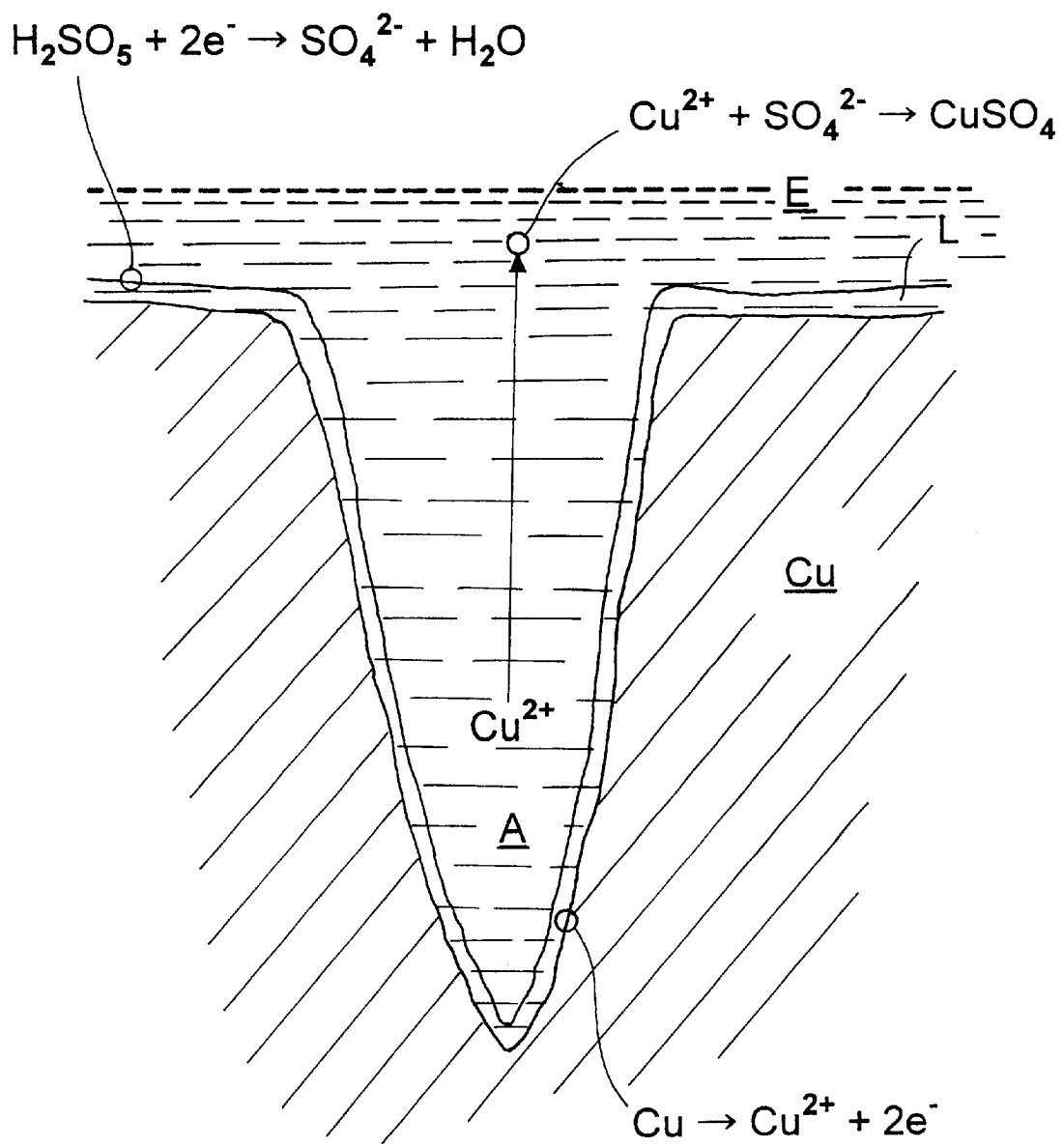
FIG. 1 is a schematic view showing a mechanism for etching by an embodiment of a liquid etchant according to the present invention.

Referring first to FIG. 1, immersion or dipping of copper in an embodiment of a liquid etchant according to the present invention is schematically illustrated. A liquid etchant of the illustrated embodiment is prepared by compounding sulfuric acid ($H_2SO_4$) acting as an oxo acid, hydrogen peroxide ($H_2O_2$) acting as a peroxide and 5-aminotetrazole acting as a tetrazole for an auxiliary component with each other.

Figure 4:
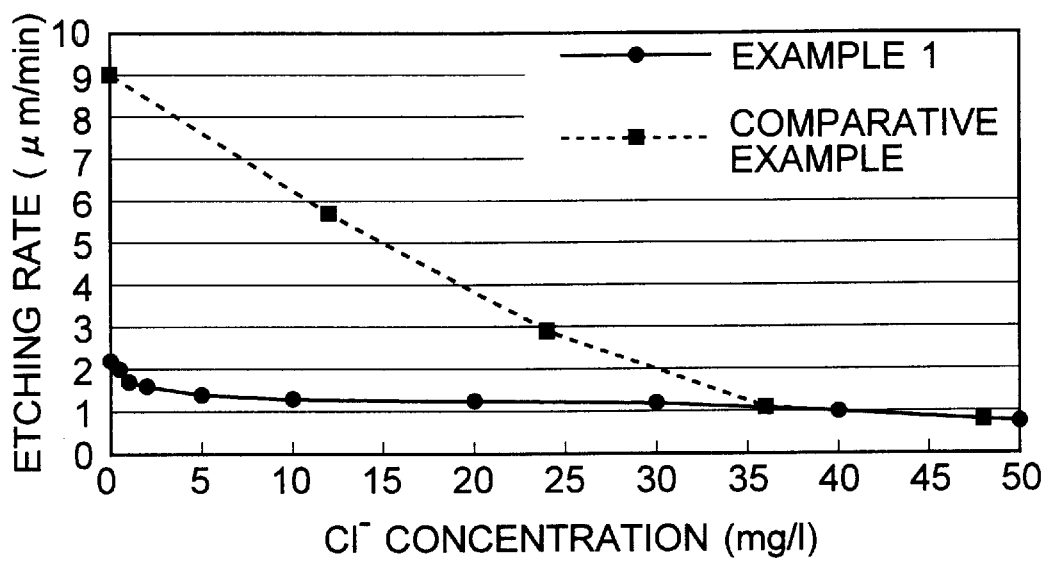
FIG. 4 is a graphical representation showing etching rate characteristics of a liquid etchant of the present invention prepared in Example 1 with respect to a chlorine ion concentration while comparing the characteristics with those of a liquid etchant obtained in Comparative Example.
Figure 5:
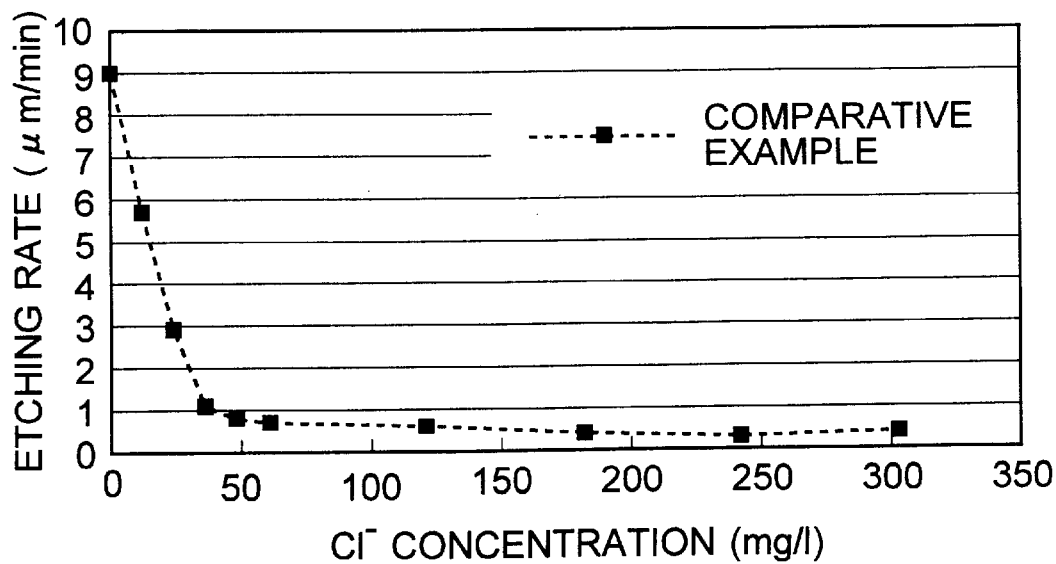
FIG. 5 is a graphical representation showing the etching rate characteristics of the liquid etchant obtained in Comparative Example with respect to a chlorine ion concentration.

The liquid etchant contains 5-aminotetrazole, to thereby permit etching of copper to be carried out without using any halide, so that an etching rate thereof may stably have a level of about 1 $\mu$m/min or more without being affected by a chlorine ion concentration, as shown in FIG. 4. This permits the etching to be attained in a short period of time and copper to be formed thereon with a roughened surface increased in acid resistance.

A mechanism for etching a copper surface by the liquid etchant is supposed as follows.

More particularly, as shown in FIG. 1, when copper Cu is dipped in the liquid etchant E, 5-aminotetrazole is permitted to form a carrier layer L on a surface of the copper Cu. Also, sulfuric acid ($H_2SO_4$) is oxidized by hydrogen peroxide ($H_2O_2$) in the liquid etchant E, resulting in peroxomonosulfuric acid ($H_2SO_5$) being produced according to the following chemical equation (1):

$$H_2SO_4 + H_2O_2 \rightarrow H_2SO_5 + H_2O \quad (1)$$

Also, the copper Cu, as indicated by the following chemical equation (2), causes copper ions to selectively elute from a number of crystal defects formed or present on the surface thereof into the liquid etchant E, resulting in emitting electrons, which are then fed through the carrier layer L to the peroxomonosulfuric acid.

$$Cu \rightarrow Cu^{2+} + 2e^- \quad (2)$$

This results in the peroxomonosulfuric acid being reduced as indicated by the following chemical equation (3):

$$H_2SO_5 + 2e^- \rightarrow SO_4^{2-} + H_2O \quad (3)$$

This causes water to be produced at an interface between the carrier layer L and the liquid etchant E. Thus, the carrier layer L keeps the surface of the copper Cu statically stable and functions as a mediation layer for the electrons, so that direct reaction between the copper Cu and the peroxomonosulfuric acid may be regulated.

Water thus produced at the interface between the carrier layer L and the liquid etchant E leads to formation of a concentration gradient of copper ions in the carrier layer L, wherein the concentration is increased near the copper Cu and decreased near the liquid etchant E. Also, flow of the liquid etchant E is rendered minimum in the deepest portion of each of the crystal defects, which portion is indicated at reference character A in FIG. 1, so that an action as a local cell may be increased in the deepest portion A of the crystal defect to promote etching of the copper Cu in the deepest portion A, resulting in irregularities of an increased depth being formed on the surface of the copper Cu, that is, the surface of the copper Cu is roughened.

Now, another embodiment of a liquid etchant according to the present invention will be described, which is prepared by compounding sulfuric acid ($H_2SO_4$) acting as an oxo acid, hydrogen peroxide ($H_2O_2$) acting as a peroxide and 1,2,3-azole acting as an auxiliary component with each other.

The liquid etchant of this embodiment, as described above, contains 1,2,3-azole, to thereby permit etching of copper to be carried out without using any halide, so that an etching rate thereof may stably have a level as high as about 3 $\mu$m/min or more. This permits the etching to be attained in a short period of time and copper to be formed thereon with a roughened surface increased in acid resistance. The etching is considered to be carried out in substantially the same manner as described with reference to FIG. 1.

Now, manufacturing of a printed circuit board using each of the above-described liquid etchants of the present invention will be described with reference to FIG. 2 by way of example.

Figure 2:
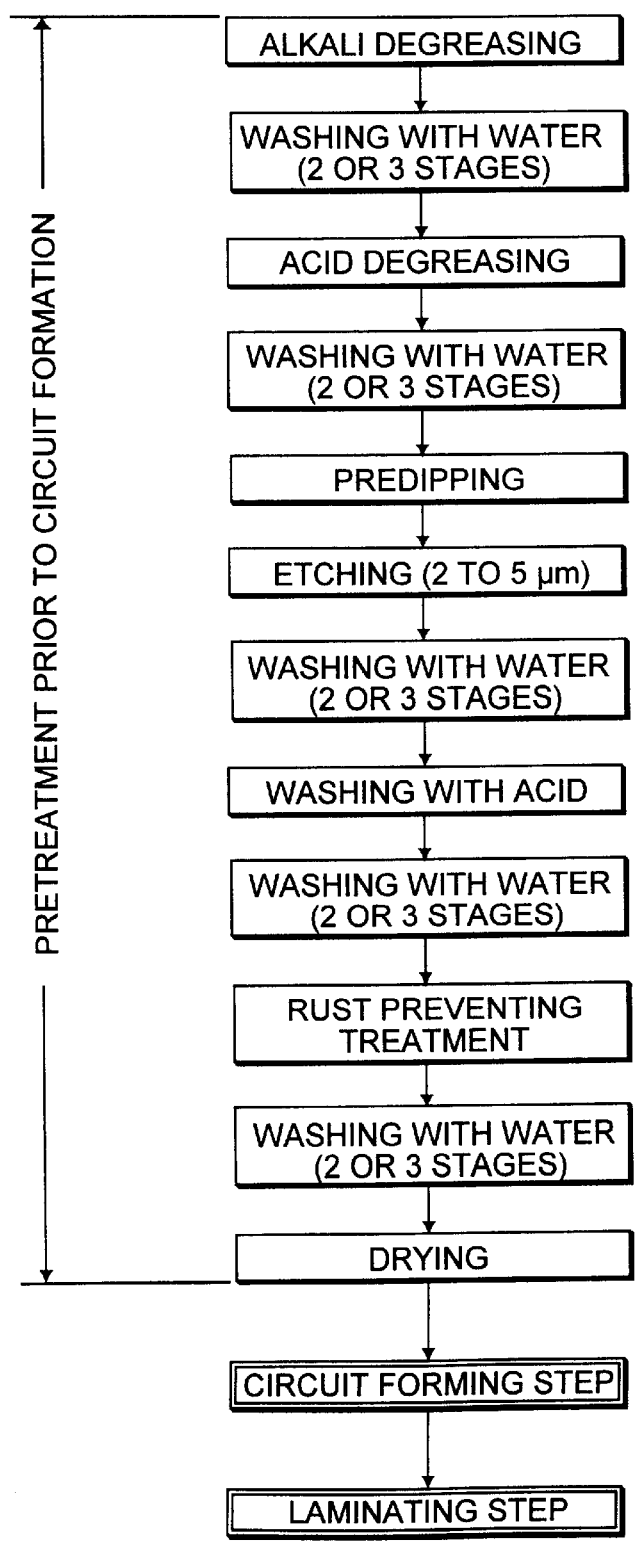
FIG. 2 is a flow chart showing steps in manufacturing of a printed circuit board using the liquid etchant.

In manufacturing of the printed circuit board shown in FIG. 2, an inner layer material is made by laminating a copper foil on a surface of a resin plate made of epoxy resin or the like. The inner layer material thus formed is subjected to a preliminary treatment step prior to circuit formation, a circuit forming step such as patterning and the like, a laminating step of an outer layer material, a through-hole formation step (not shown) and the like, resulting in a printed circuit board being manufactured. In the preliminary treatment step prior to the circuit formation, the inner layer material is subjected to treatments, such as alkali degreasing, washing with water, acid degreasing, washing with water, predipping, etching, washing with water, washing with acid, washing with water, rust preventing, washing with water and drying in order. The treatments extending from the alkali degreasing to the predipping and from the rust preventing to the subsequent washing with water are not necessarily required and are carried out as desired depending on surface conditions of copper to be etched.

In the illustrated embodiment, the circuit forming step, laminating step and through-hole formation step may be constructed in such a manner as widely known in the art. Also, the alkali degreasing, acid degreasing, predipping, washing with acid, rust preventing and drying which are carried out in the preliminary treatment step may be likewise carried out in such a manner as widely known in the art.

In the etching treatment in the preliminary treatment step prior to the circuit formation, either the liquid etchant obtained by compounding sulfuric acid ($H_2SO_4$) acting as the oxo acid, hydrogen peroxide ($H_2O_2$) acting as the peroxide and 5-aminotetrazole acting as the tetrazole for the auxiliary component with each other or the liquid etchant obtained by compounding sulfuric acid ($H_2SO_4$) acting as the oxo acid, hydrogen peroxide ($H_2O_2$) acting as the peroxide and 1,2,3-azole acting as the auxiliary component with each other is used, in which an inner layer material is dipped, resulting in a surface of a copper foil of the inner layer material being etched.

The etching using the above-described liquid etchant results in the copper foil being formed with a roughened surface which has irregularities increased in depth and which is acid-insoluble. This permits an outer layer material made of resin or the like to be firmly fixed onto a copper conductive pattern in the subsequent laminating step. Also, this effectively prevents production of copper oxide and the like, as well as formation of any defect called a pink ring during electroplating after the through-hole formation step. Further, the liquid etchant is free of any halogen ion, to thereby eliminate a reduction in an etching rate due to halogen ions, resulting in formation of the roughened surface being carried out in a short period of time.

As described above, the illustrated embodiment is so constructed so as not to require any halogen ion. Also, the illustrated embodiment is constructed so as to carry out etching using the liquid etchant of which an etching rate is not affected by a halogen ion concentration, resulting in the copper foil being formed with the roughened surface which is acid-insoluble. This permits formation of the roughened surface to be attained in a short period of time during manufacturing of the printed board. Also, the illustrated embodiment eliminates a necessity of treatments such as soft etching and the like, to thereby reduce a period of time required for manufacturing of the printed board and the number of steps therefor, so that the printed board in which the copper conductive pattern and the outer layer material made of resin or the like are firmly fixed to each other may be manufactured with increased efficiency.

Figure 3:
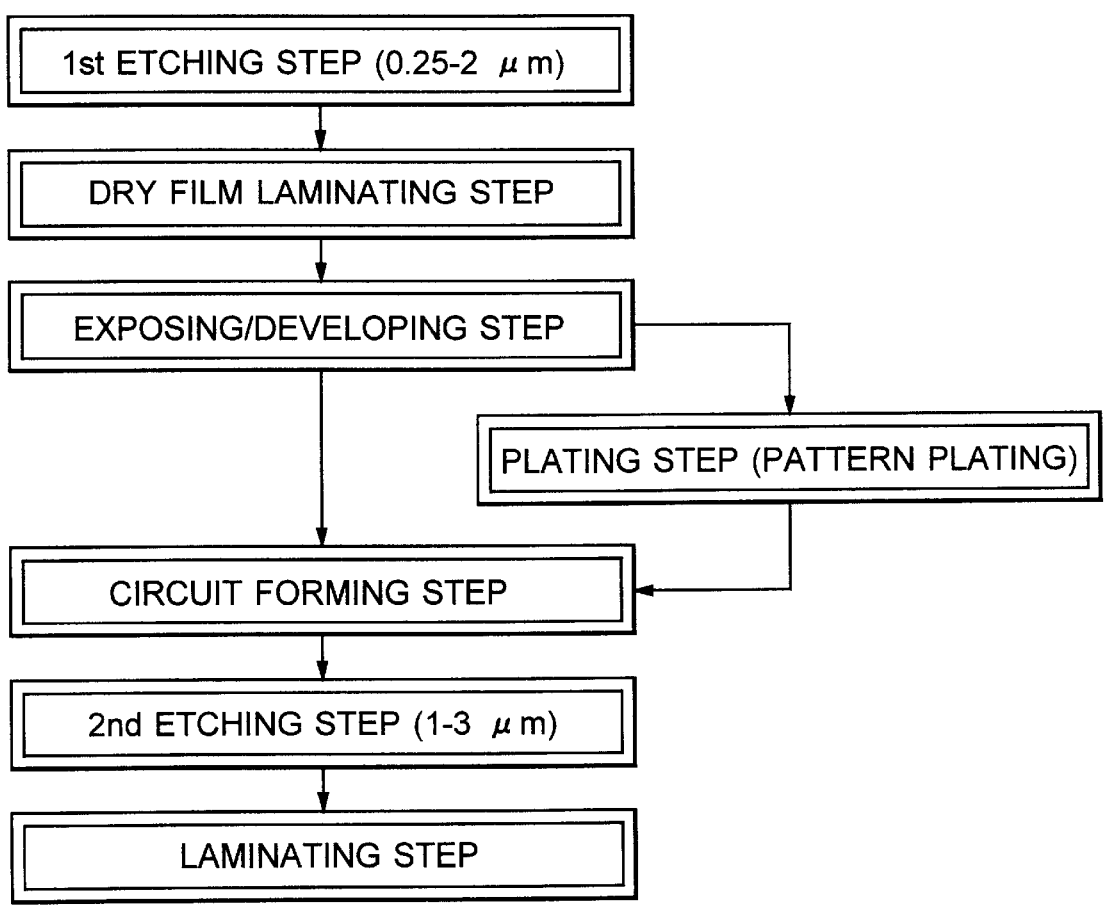
FIG. 3 is a flow chart showing steps in another manufacturing of a printed circuit board using the liquid etchant twice.

The printed board may be manufactured by using any one of the above-described liquid etchants of the present invention twice or carrying out etching using the liquid etchant twice, as shown in FIG. 3. More particularly, as shown in FIG. 3, the first etching is carried out using any one of the above-described liquid etchants prior to adhesion of a dry film, to thereby roughen the surface of the copper foil (first etching step). The first etching is carried out so that the roughened surface is formed with irregularities having a depth of between 0.25 $\mu$m and 2 $\mu$m. Then, the dry film is laminated on the roughened surface of the copper foil (dry film laminating step). The laminating step permits the dry film to be firmly fixed to the surface of the copper foil because the surface is effectively roughened.

Then, an exposing/developing step and a circuit forming step are carried out. Alternatively, when pattern plating techniques are employed, a plating step is carried out between the exposing/developing step and the circuit forming step, leading to formation of the copper conductive pattern. Then, the second etching step is executed using any one of the liquid etchants described above, resulting in a surface of the copper conductive pattern being etched into a depth of between 1 $\mu$m and 3 $\mu$m. The first and second etching steps each use any one of the liquid etchants described above, resulting in being carried out in a short period of time irrespective of inclusion of chlorine. The etching carried out twice preferably provides the surface of the copper conductive pattern with irregularities having a depth of between 2 $\mu$m and 5 $\mu$m in total.

Then, an outer layer material made of resin is laminated on the surface of the copper conductive pattern (laminating step), as in the procedure shown in FIG. 2. The above-described roughening of the surface of the copper conductive pattern permits the outer layer material to be securely adhered to the copper conductive pattern.

As can be seen from the foregoing, the liquid etchant of the present invention exhibits an increased etching rate without using any halide and without being substantially affected by a concentration of halogen, because of using tetrazole or 1,2,3-azole as the auxiliary component; so that copper may be provided thereon with a roughened surface increased in acid resistance. Such a roughened surface of copper ensures firm adhesion between a copper conductive pattern or the like and an outer layer material made of resin or the like during manufacturing of a printed board and permits the manufacturing to be highly simplified.

The invention will be understood more readily with reference to the following examples; however, the examples are intended to illustrate the invention and are not to be construed to limit the scope of the invention.

EXAMPLE 1

A copper-clad laminate made of epoxy resin filled with a glass fabric was dipped in an aqueous etching solution or liquid etchant shown in Table 1 for three minutes, to thereby be etched, so that a copper surface of the copper-clad laminate was roughened. The liquid etchant exhibits characteristics which permit an etching rate thereof to be stabilized with respect to a concentration of a chlorine ion as shown in FIG. 4 or which permit the etching rate to be kept constant irrespective of a variation in concentration of the chlorine ion. The etching rate has a level of about 1 $\mu$m/min or more. In Example 1, a concentration of hydrogen peroxide was set to be 40 g/l, so that the etching rate was converted into that for a concentration of hydrogen peroxide of 80 g/l in FIG. 4.

TABLE 1

| Liquid Etchant of Example 1 (Temperature: 25° C.) | |
|---|---|
| $H_2O_2$ | 40 g/l |
| $H_2SO_4$ | 90 g/l |
| 5-Aminotetrazole | 4 g/l |

Figure 6:
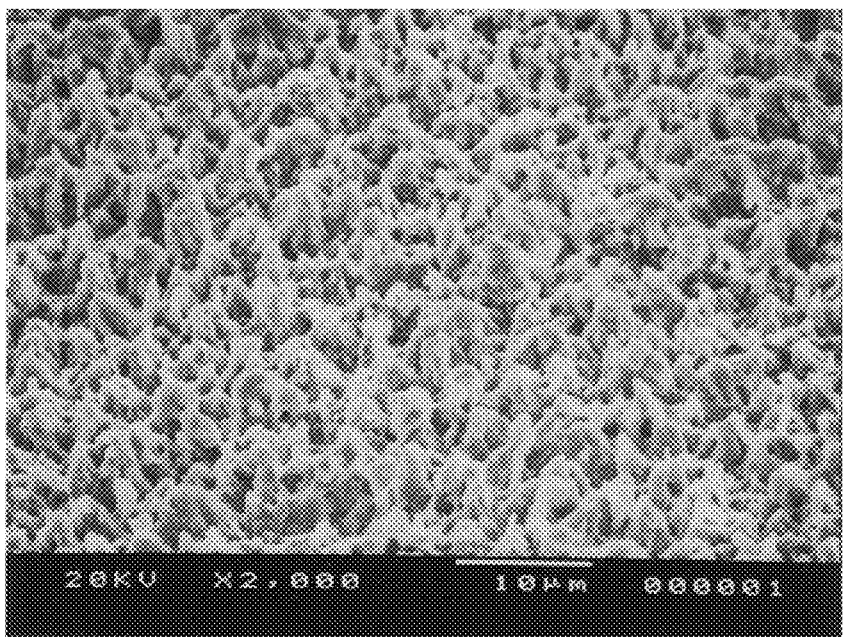
FIGS. 6 to 28 are photomicrographs at ×2000 magnification by a scanning electron microscope (SEM) showing respective surfaces of copper-clad laminates which were etched by liquid etchants of the present invention prepared in Examples 1 to 23.

The copper surface of the copper-clad laminate was observed by means of a scanning electron microscope (SEM). As a result, it was found that the copper surface is formed thereon with acicular or needle-like projections as shown in FIG. 6. Comparison in time required for the etching was made between Example 1 and Comparative Example revealed that Comparative Example causes the etching rate to be set at a level as low as about 0.5 $\mu$m/min, whereas Example 1 permits it to be stably set at a level as high as 1 $\mu$m. Thus, it was found that Example 1 substantially reduces a period of time required for the etching.

EXAMPLE 2

Figure 7:
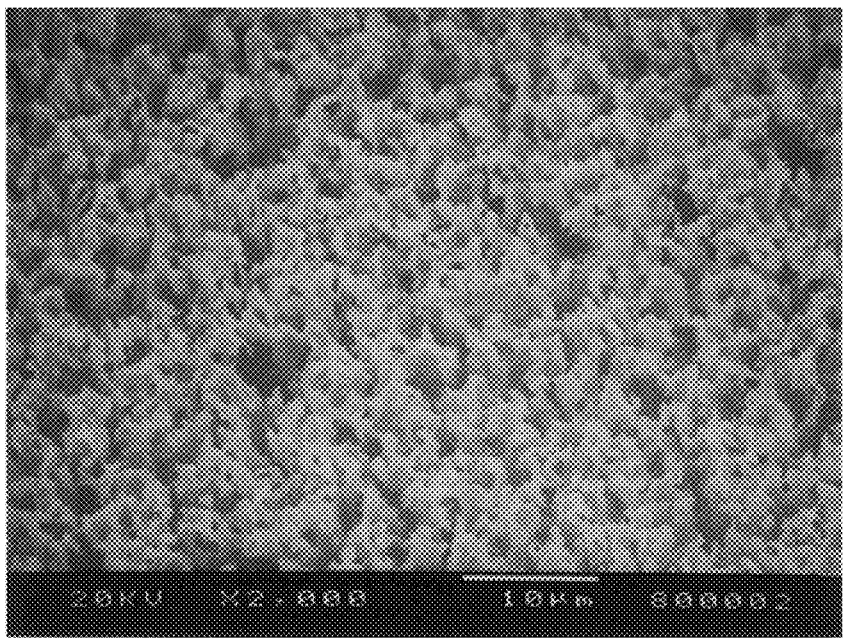

A copper-clad laminate made of epoxy resin filled with a glass fabric was subjected to a procedure similar to Example 1 described above. More particularly, the laminate was dipped in a liquid etchant shown in Table 2 for three minutes, to thereby be etched, so that a copper surface of the copper-clad laminate was roughened. In the liquid etchant shown in Table 2, perchloric acid ($HClO_4$) was substituted for sulfuric acid ($H_2SO_4$) shown in Table 1. In addition, benzotriazole was added to the liquid etchant. In Example 2, the liquid etchant exhibits an etching rate substantially equal to that used in Example 1 shown in FIG. 4. Observation of the surface of the copper by an SEM indicated that it is formed with such projections as shown in FIG. 7, resulting in the surface being effectively roughened.

TABLE 2

Liquid Etchant of Example 2
(Temperature: 25° C.)

| | |
|---|---|
| $H_2O_2$ | 40 g/l |
| $HClO_4$ | 150 g/l |
| 5-Aminotetrazole | 3 g/l |
| Benzotriazole | 4 g/l |

EXAMPLE 3

Figure 8:
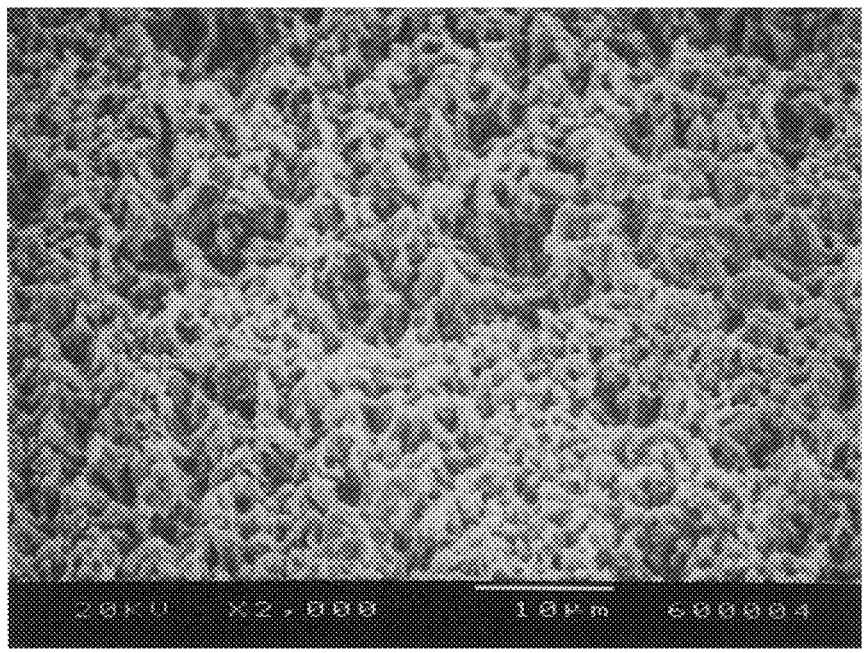

A copper-clad laminate made of epoxy resin filled with a glass fabric was subjected to a procedure similar to Example 1 described above. More particularly, the laminate was dipped in a liquid etchant shown in Table 3 for three minutes, to thereby be etched, so that a copper surface of the copper-clad laminate was roughened. In the liquid etchant shown in Table 3, phosphoric acid was used as the oxo acid. In Example 3, the liquid etchant exhibits an etching rate substantially equal to that used in Example 1 shown in FIG. 4. Observation of the surface of the copper by an SEM revealed that it is formed with such projections as shown in FIG. 8, resulting in the surface being satisfactorily roughened.

TABLE 3

Liquid Etchant of Example 3
(Temperature: 25° C.)

| | |
|---|---|
| $H_2O_2$ | 40 g/l |
| $H_3PO_4$ | 150 g/l |
| 5-Aminotetrazole | 3 g/l |
| Benzotriazole | 4 g/l |

EXAMPLE 4

Figure 9:
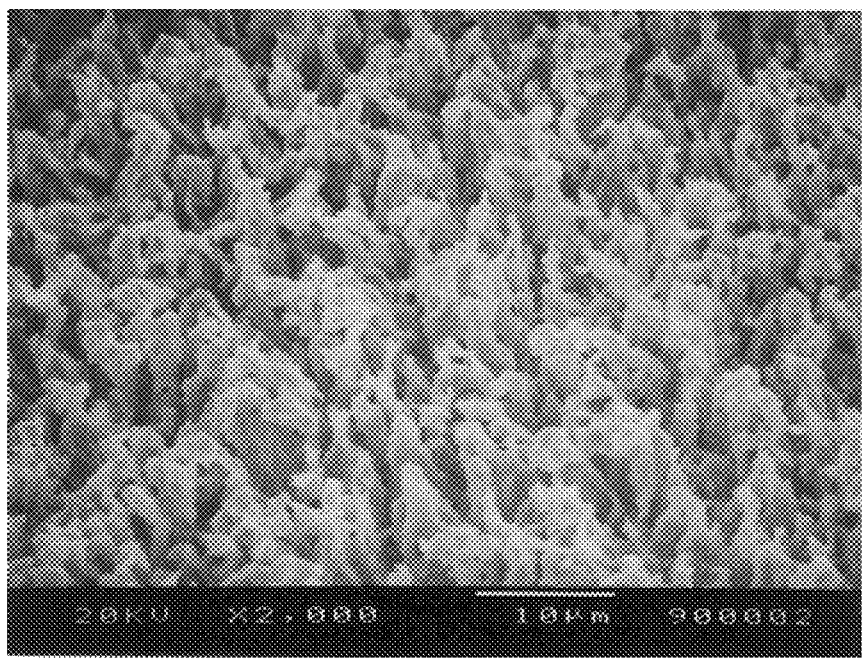

A copper-clad laminate made of epoxy resin filled with a glass fabric was subjected to a procedure similar to Example 1 described above. More particularly, the laminate was dipped for three minutes in a liquid etchant shown in Table 4 in which 2-hydroxyethane-1-sulfonic acid was used as a derivative of the oxo acid, so that a copper surface of the copper-clad laminate was roughened. In Example 4, the liquid etchant exhibits an etching rate having characteristics similar to those of the liquid etchant used in Example 1 shown in FIG. 4. Observation of the surface of the copper by an SEM revealed that it is formed with such projections as shown in FIG. 9, resulting in the surface being substantially roughened.

TABLE 4

Liquid Etchant of Example 4
(Temperature: 25° C.)

| | |
|---|---|
| $H_2O_2$ | 40 g/l |
| $HOC_2H_4SO_3H$ | 130 g/l |
| 5-Aminotetrazole | 3 g/l |
| Benzotriazole | 6 g/l |

EXAMPLE 5

Figure 10:
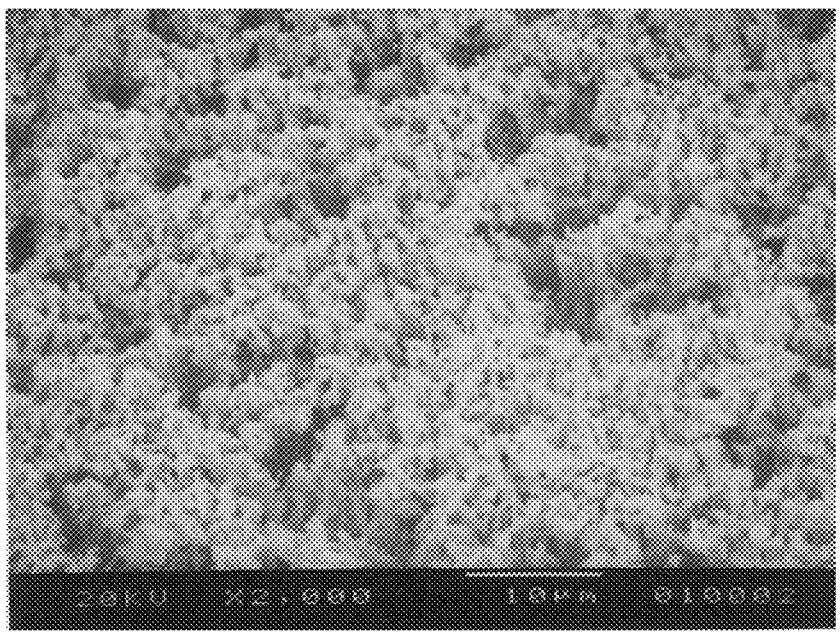

A copper-clad laminate made of epoxy resin filled with a glass fabric was subjected to a procedure similar to Example 1 described above. More particularly, the laminate was dipped for three minutes in a liquid etchant shown in Table 5 in which methanesulfonic acid was used as a derivative of the oxo acid, so that a copper surface of the copper-clad laminate was roughened. In Example 5, the liquid etchant exhibits an etching rate substantially equal to that used in Example 1 described above. Observation of the surface of the copper by an SEM revealed that it is formed with such projections as shown in FIG. 10, resulting in the surface being significantly roughened.

TABLE 5

Liquid Etchant of Example 5
(Temperature: 25° C.)

| | |
|---|---|
| $H_2O_2$ | 40 g/l |
| $CH_3SO_3H$ | 100 g/l |
| 5-Aminotetrazole | 3 g/l |
| Benzotriazole | 8 g/l |

EXAMPLE 6

Figure 11:
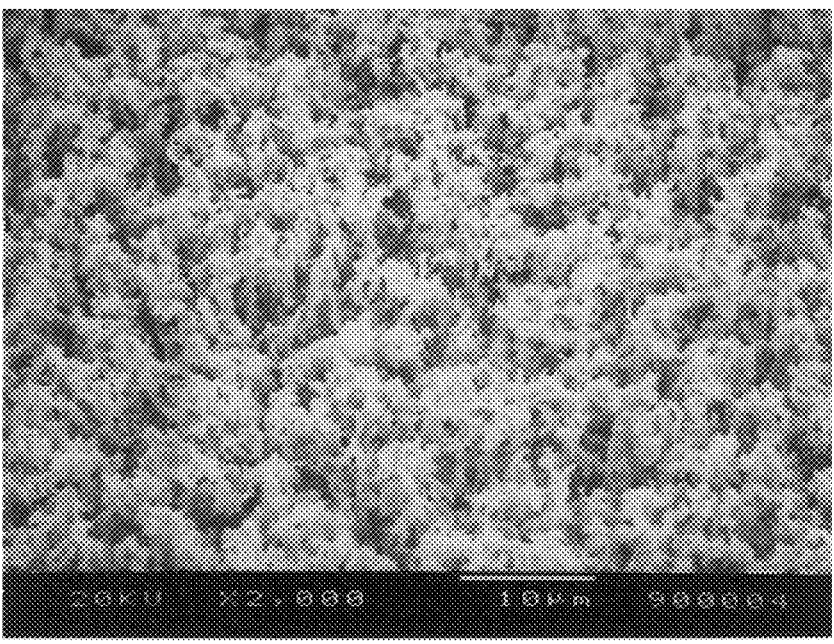

A copper-clad laminate was dipped for three minutes in a liquid etchant shown in Table 6 as in Examples described above, so that a copper surface of the copper-clad laminate was roughened. In Example 6, the liquid etchant in which nitric acid is used as the oxo acid exhibits an etching rate substantially equal to that used in Example 1 described above. Observation of the surface of the copper by an SEM revealed that it is formed with such projections as shown in FIG. 11, resulting in the surface being satisfactorily roughened.

TABLE 6

Liquid Etchant of Example 6
(Temperature: 25° C.)

| | |
|---|---|
| $H_2O_2$ | 40 g/l |
| $HNO_3$ | 50 g/l |
| 5-Aminotetrazole | 4 g/l |
| Benzotriazole | 6 g/l |

EXAMPLE 7

Figure 12:
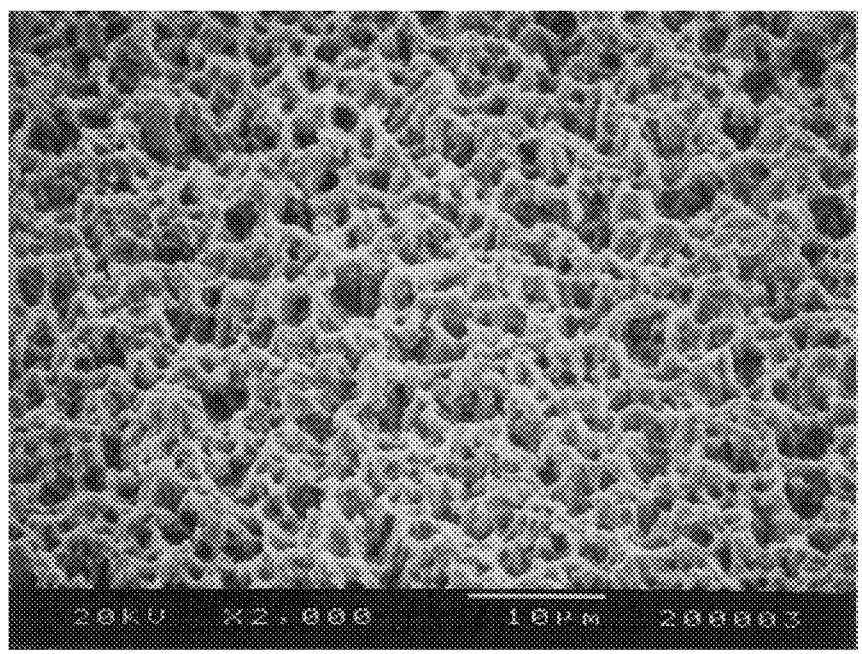

A copper-clad laminate made of epoxy resin filled with a glass fabric was dipped for three minutes in a liquid etchant shown in Table 7 as in Examples described above, so that a copper surface of the copper-clad laminate was roughened. In Example 7, the liquid etchant in which sulfuric acid is used as the oxo acid, hydrogen peroxide is used as the peroxide, 5-aminotetrazole is used as the azole and sodium chloride is used as the halide exhibits an etching rate substantially equal to that used in Example 1 described above. Observation of the surface of the copper by an SEM revealed that it is formed with such projections as shown in FIG. 12, resulting in the surface being satisfactorily roughened.

TABLE 7

Liquid Etchant of Example 7
(Temperature: 25° C.)

| | |
|---|---|
| $H_2O_2$ | 40 g/l |
| $H_2SO_4$ | 90 g/l |
| 5-Aminotetrazole | 3 g/l |
| Sodium chloride (Cl) | 16 (10) mg/l |

EXAMPLE 8

Figure 13:
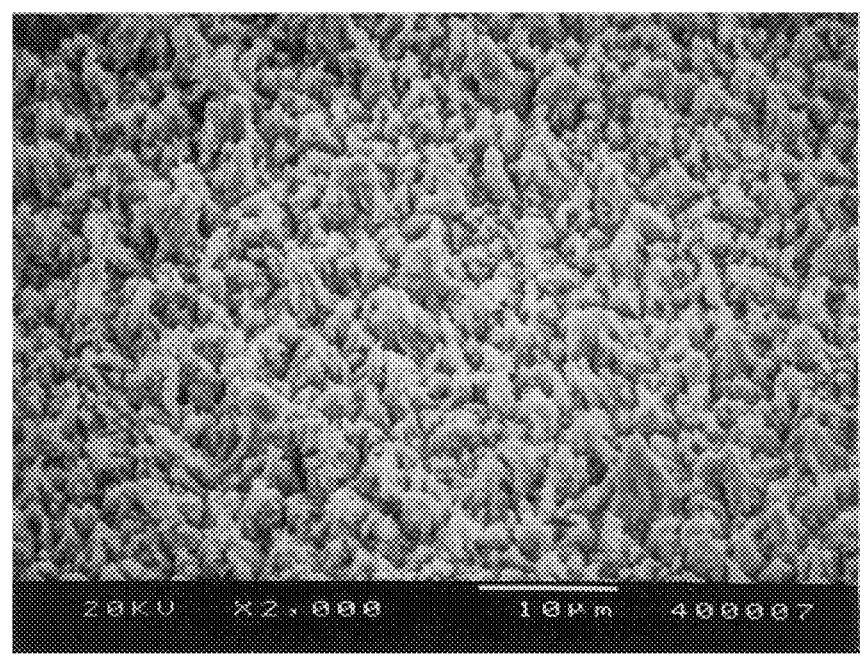

A copper-clad laminate made of epoxy resin filled with a glass fabric was dipped for three minutes in a liquid etchant shown in Table 8 in substantially the same manner as in Examples described above, so that a copper surface of the copper-clad laminate was roughened. In the liquid etchant of Example 8, sulfuric acid was used as the oxo acid, hydrogen peroxide was used as the peroxide, and 5-aminotetrazole and benzotriazole were used as the azole. The liquid etchant exhibits an etching rate having characteristics similar to those shown in FIG. 4, resulting in roughening of the surface being executed in a short period of time. Observation of the surface of the copper by an SEM revealed that it is formed with such projections as shown in FIG. 13, resulting in the surface being satisfactorily roughened.

TABLE 8

| Liquid Etchant of Example 8 (Temperature: 25° C.) | |
|---|---|
| $H_2O_2$ | 40 g/l |
| $H_2SO_4$ | 90 g/l |
| 5-Aminotetrazole | 3 g/l |
| Benzotriazole | 4 g/l |

EXAMPLE 9

Figure 14:
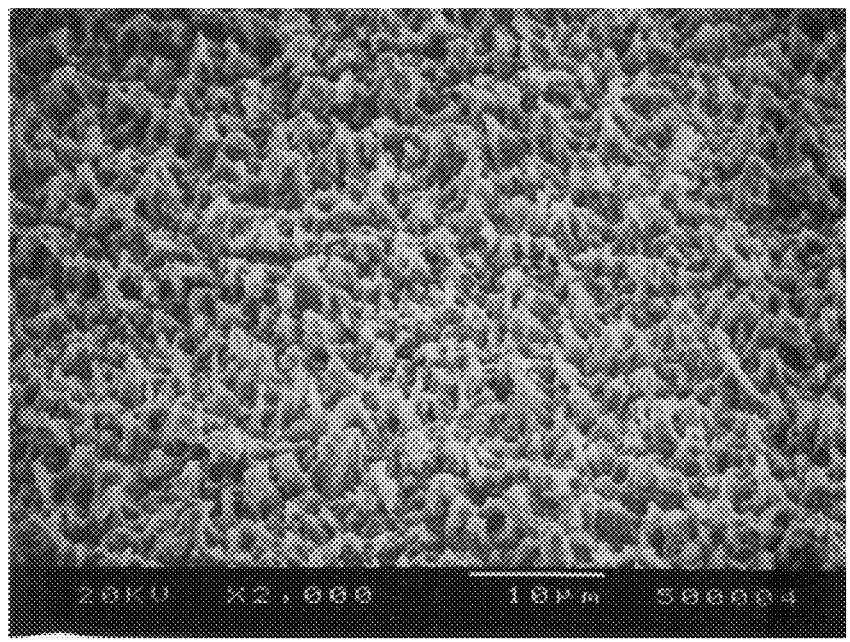

A copper-clad laminate made of epoxy resin filled with a glass fabric was dipped for three minutes in a liquid etchant shown in Table 9 in substantially the same manner as in Examples described above, so that a copper surface of the copper-clad laminate was roughened. In the liquid etchant of Example 9, sulfuric acid was used as the oxo acid, hydrogen peroxide was used as the peroxide, and 5-aminotetrazole and tolyltriazole were used as the azole. The liquid etchant exhibits an etching rate substantially equal to that in Example 1 described above. Observation of the surface of the copper by an SEM revealed that it is formed with such projections as shown in FIG. 14, resulting in the surface being satisfactorily roughened.

TABLE 9

| Liquid Etchant of Example 9 (Temperature: 25° C.) | |
|---|---|
| $H_2O_2$ | 40 g/l |
| $H_2SO_4$ | 90 g/l |
| 5-Aminotetrazole | 3 g/l |
| Tolyltriazole | 2 g/l |

EXAMPLE 10

Figure 15:
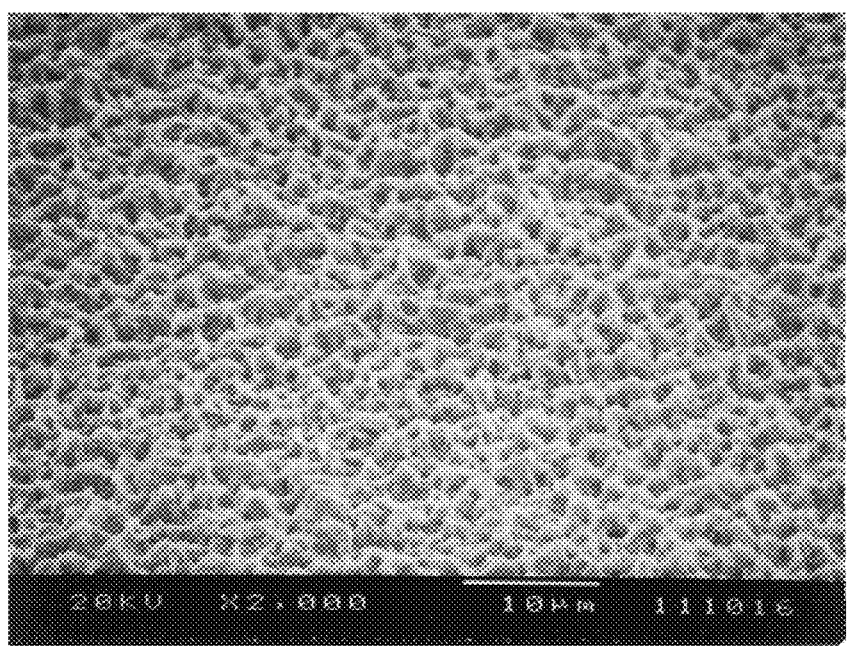

A copper-clad laminate made of epoxy resin filled with a glass fabric was dipped for three minutes in a liquid etchant shown in Table 10 in substantially the same manner as in Examples described above, so that a copper surface of the copper-clad laminate was roughened. In the liquid etchant of Example 10, sulfuric acid was used as the oxo acid, hydrogen peroxide was used as the peroxide, and 5-aminotetrazole and 3-aminotriazole were used as the azole. The liquid etchant exhibits an etching rate substantially equal to that in Example 1 described above. Observation of the surface of the copper by an SEM revealed that it is formed with such projections as shown in FIG. 15, resulting in the surface being satisfactorily roughened.

TABLE 10

| Liquid Etchant of Example 10 (Temperature: 25° C.) | |
|---|---|
| $H_2O_2$ | 40 g/l |
| $H_2SO_4$ | 90 g/l |
| 5-Aminotetrazole | 3 g/l |
| 3-Aminotriazole | 1 g/l |

EXAMPLE 11

Figure 16:
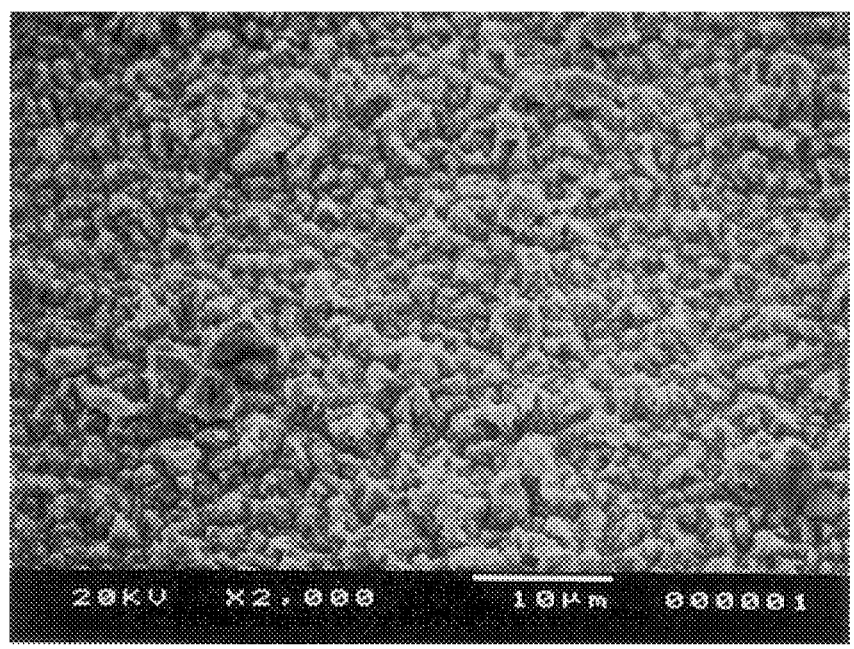

A copper-clad laminate made of epoxy resin filled with a glass fabric was dipped for one minute in a liquid etchant shown in Table 11 in substantially the same manner as in Examples described above, so that a copper surface of the copper-clad laminate was roughened. In the liquid etchant of Example 11, sulfuric acid was used as the oxo acid, hydrogen peroxide was used as the peroxide, and a combination of 5-aminotetrazole and benzotriazole was used as the azole. Observation of the surface of the copper by an SEM revealed that it is formed with such fine acicular or needle-like projections as shown in FIG. 16, resulting in the surface being satisfactorily roughened. Comparison between Example 11 and Comparative Example was carried out in connection with a period of time required for etching. As a result, it was found that Comparative Example exhibits an etching rate as low as about 0.5 $\mu$m/min, whereas Example 11 stably exhibits an etching rate exceeding 3 $\mu$m/min, thus, Example 11 permits the time to be substantially reduced. The peroxide used in Example 11 had a concentration one half as high as that in Comparative Example. This indicates that the etching rate in Example 11 is about 10 times or more as high as that in Comparative Example.

TABLE 11

| Liquid Etchant of Example 11 (Temperature: 25° C.) | |
|---|---|
| $H_2O_2$ | 40 g/l |
| $H_2SO_4$ | 90 g/l |
| 5-Aminotetrazole | 3 g/l |
| Benzotriazole | 6 g/l |

EXAMPLE 12

Figure 17:
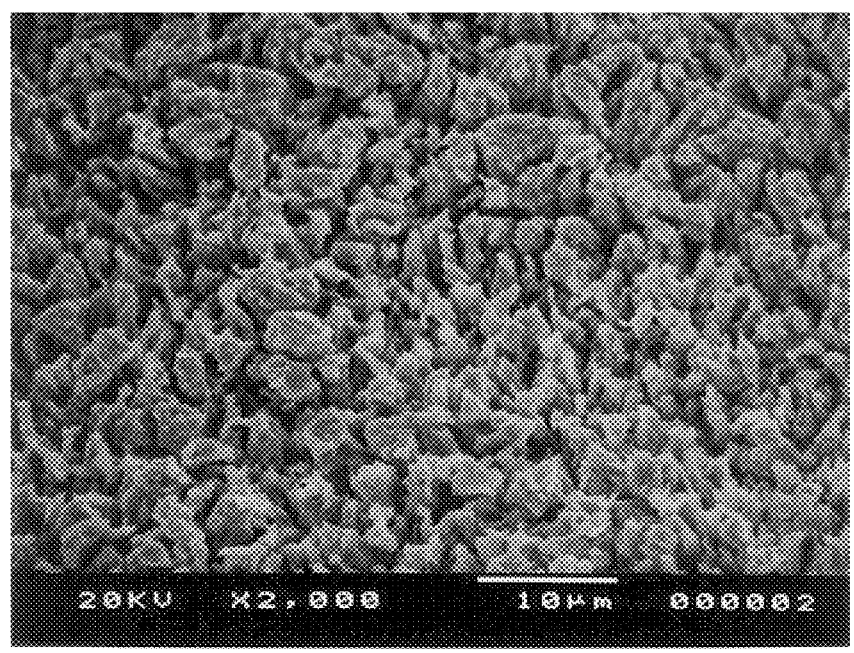

A copper-clad laminate made of epoxy resin filled with a glass fabric was dipped for one minute in a liquid etchant shown in Table 12 in substantially the same manner as in Examples described above, so that a copper surface of the copper-clad laminate was roughened. In the liquid etchant of Example 12, 2-hydroxyethane-1-sulfonic acid was used as the oxo acid, hydrogen peroxide was used as the peroxide, and a combination of 5-aminotetrazole and tolyltriazole was used as the azole. The liquid etchant exhibits an etching rate substantially equal to that in Example 11 described above. Observation of the surface of the copper by an SEM revealed that it is formed with such fine acicular or needle-like projections as shown in FIG. 17, resulting in the surface being satisfactorily roughened.

TABLE 12

| Liquid Etchant of Example 12 (Temperature: 25° C.) | |
| --- | --- |
| $H_2O_2$ | 40 g/l |
| $HOC_2H_4SO_3H$ | 130 g/l |
| 5-Aminotetrazole | 3 g/l |
| Tolyltriazole | 6 g/l |

EXAMPLE 13

Figure 18:
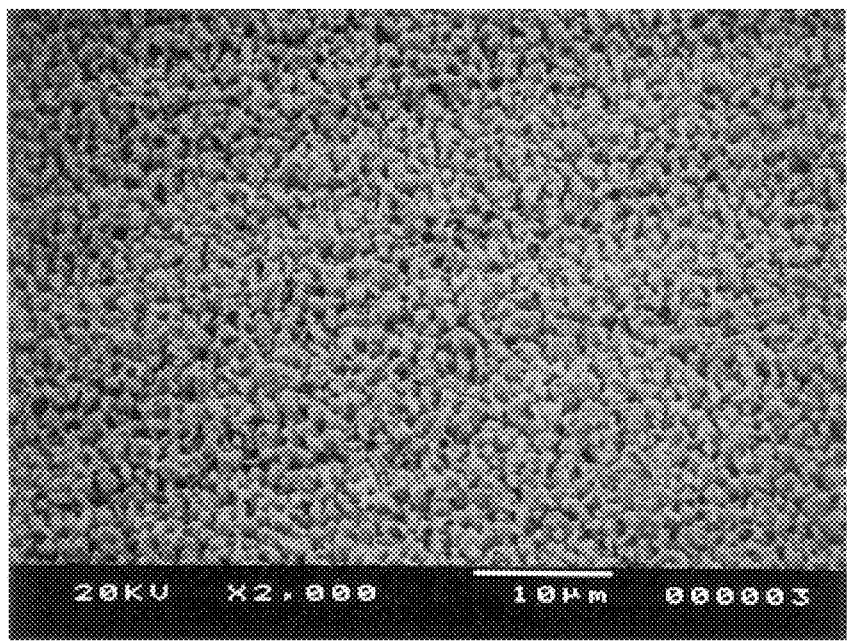

A copper-clad laminate made of epoxy resin filled with a glass fabric was dipped for one minute in a liquid etchant shown in Table 13 in substantially the same manner as in Examples described above, so that a copper surface of the copper-clad laminate was roughened. In the liquid etchant of Example 13, methanesulfonic acid was substituted for sulfuric acid in Table 11. The liquid etchant exhibits an etching rate substantially equal to that in Example 11 described above. Observation of the surface of the copper by an SEM revealed that it is formed with such fine acicular or needle-like projections as shown in FIG. 18, resulting in the surface being satisfactorily roughened.

TABLE 13

| Liquid Etchant of Example 13 (Temperature: 25° C.) | |
| --- | --- |
| $H_2O_2$ | 40 g/l |
| $CH_3SO_3H$ | 100 g/l |
| 5-Aminotetrazole | 3 g/l |
| Benzotriazole | 8 g/l |

EXAMPLE 14

Figure 19:
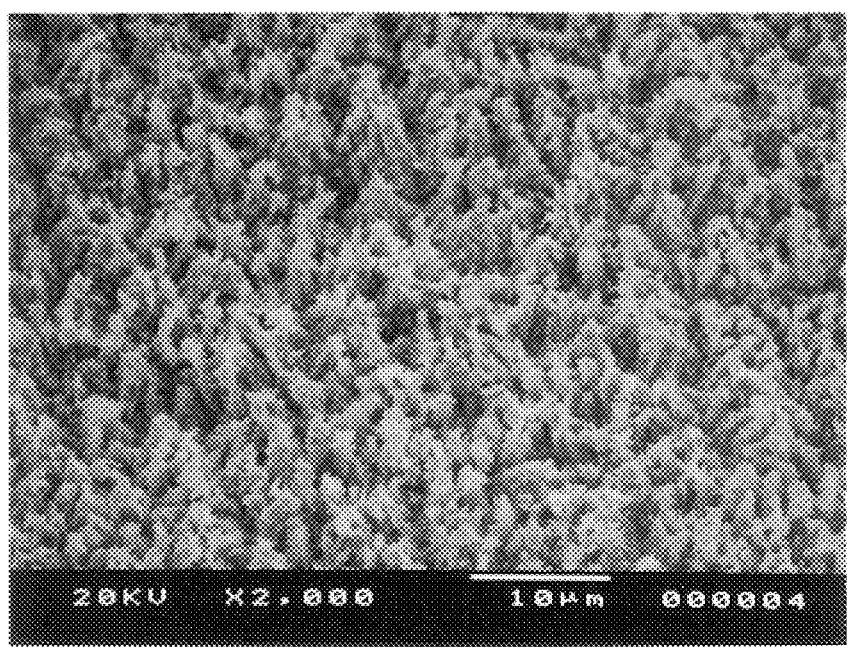

A copper-clad laminate made of epoxy resin filled with a glass fabric was dipped for two minutes in a liquid etchant shown in Table 14 in substantially the same manner as in Examples described above, so that a copper surface of the copper-clad laminate was roughened. In the liquid etchant of Example 14, sulfuric acid and phosphoric acid were used as the oxo acid, and a combination of benzotriazole and tetrazole was used as the azole. The liquid etchant of Example 14 exhibits an etching rate substantially one half as high as that in Example 11 described above. Observation of the surface of the copper by an SEM revealed that it is formed with such fine acicular projections as shown in FIG. 19, resulting in the surface being satisfactorily roughened.

TABLE 14

| Liquid Etchant of Example 14 (Temperature: 30° C.) | |
| --- | --- |
| $H_2O_2$ | 34 g/l |
| $H_2SO_4$ | 80 g/l |
| $H_3PO_4$ | 20 g/l |
| Tetrazole | 3 g/l |
| Benzotriazole | 6 g/l |

EXAMPLE 15

Figure 20:
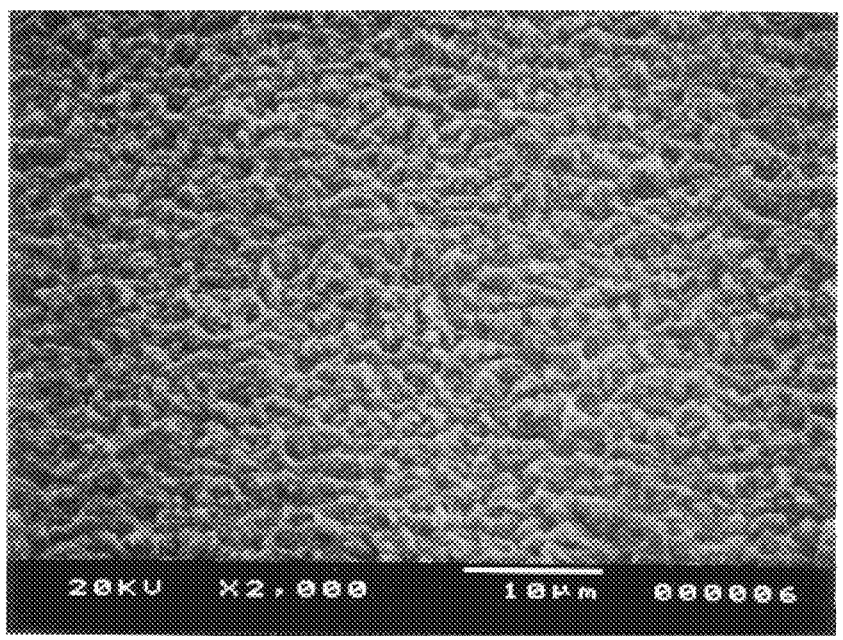

A copper-clad laminate made of epoxy resin filled with a glass fabric was dipped for one minute in a liquid etchant shown in Table 15 in substantially the same manner as in Examples described above, so that a copper surface of the copper-clad laminate was roughened. The liquid etchant of Example 15 exhibits an etching rate substantially equal to that in Example 11 described above. Observation of the surface of the copper by an SEM revealed that it is formed with such fine acicular projections as shown in FIG. 20, resulting in the surface being satisfactorily roughened.

TABLE 15

| Liquid Etchant of Example 15 (Temperature: 30° C.) | |
| --- | --- |
| $H_2O_2$ | 34 g/l |
| $H_2SO_4$ | 80 g/l |
| $H_3PO_4$ | 20 g/l |
| 5-Aminotetrazole | 3 g/l |
| Benzotriazole | 6 g/l |

EXAMPLE 16

Figure 21:
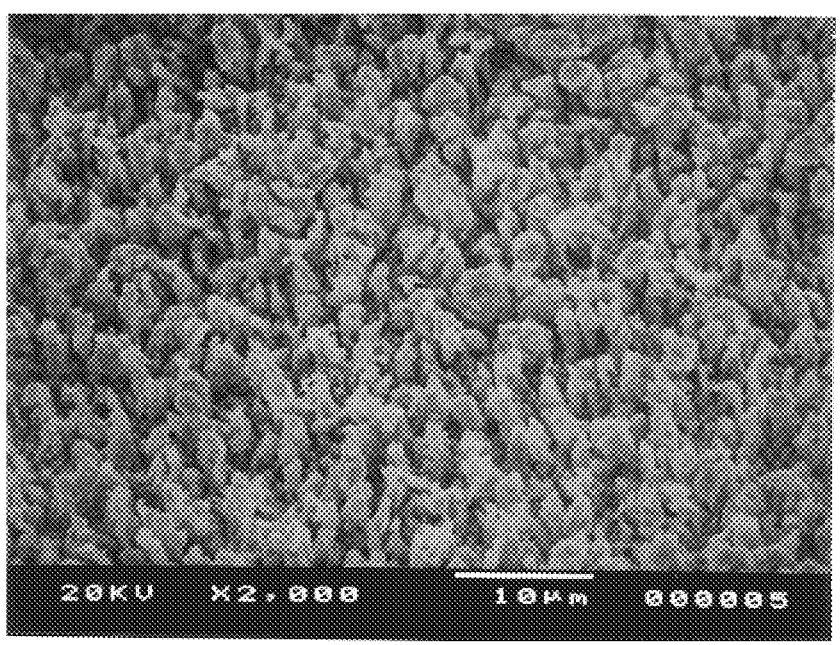

A copper-clad laminate made of epoxy resin filled with a glass fabric was dipped for one minute in a liquid etchant shown in Table 16 in substantially the same manner as in Examples described above, so that a copper surface of the copper-clad laminate was roughened. The liquid etchant of Example 16 exhibits an etching rate substantially equal to that in Example 11 described above. Observation of the surface of the copper by an SEM revealed that it is formed with such fine acicular projections as shown in FIG. 21, resulting in the surface being satisfactorily roughened.

TABLE 16

| Liquid Etchant of Example 16 (Temperature: 30° C.) | |
| --- | --- |
| $H_2O_2$ | 34 g/l |
| $H_2SO_4$ | 80 g/l |
| $H_3PO_4$ | 20 g/l |
| 5-Methyltetrazole | 3 g/l |
| Benzotriazole | 6 g/l |

EXAMPLE 17

Figure 22:
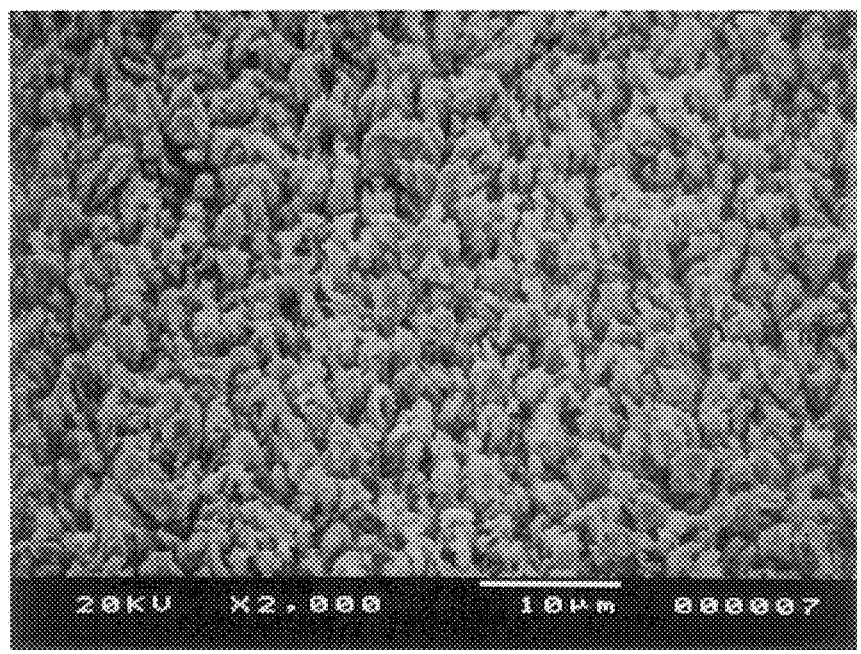

A copper-clad laminate made of epoxy resin filled with a glass fabric was dipped for one minute in a liquid etchant shown in Table 17 in substantially the same manner as in Examples described above, so that a copper surface of the copper-clad laminate was roughened. The liquid etchant of Example 17 exhibits an etching rate substantially equal to that in Example 11 described above. Observation of the surface of the copper by an SEM revealed that it is formed with such fine acicular projections as shown in FIG. 22, resulting in the surface being satisfactorily roughened.

TABLE 17

| Liquid Etchant of Example 17 (Temperature: 30° C.) | |
| --- | --- |
| $H_2O_2$ | 34 g/l |
| $H_2SO_4$ | 80 g/l |
| $H_3PO_4$ | 20 g/l |
| Triazole | 3 g/l |
| Benzotriazole | 6 g/l |

EXAMPLE 18

Figure 23:
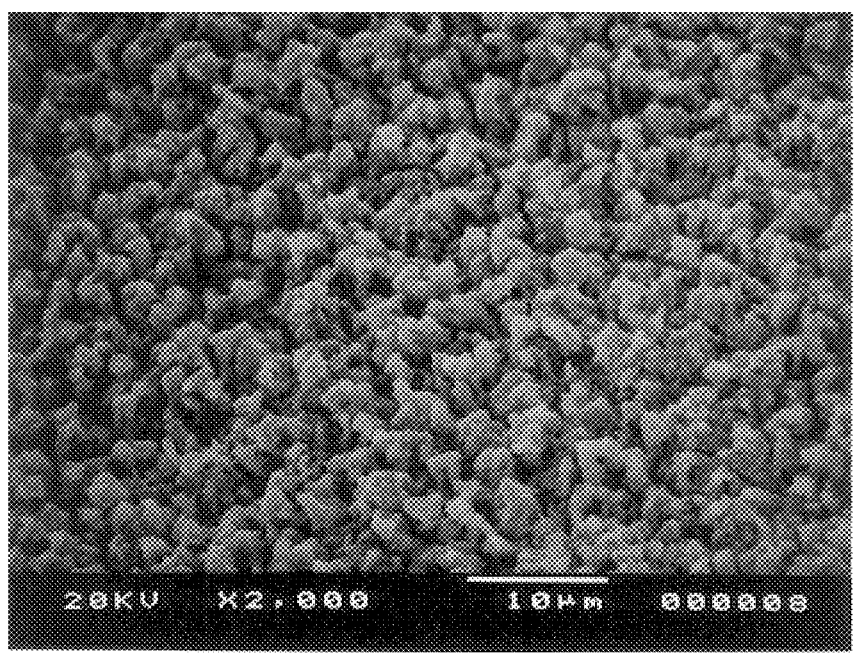

A copper-clad laminate made of epoxy resin filled with a glass fabric was dipped for one minute in a liquid etchant shown in Table 18 in substantially the same manner as in Examples described above, so that a copper surface of the copper-clad laminate was roughened. The liquid etchant of Example 18 exhibits an etching rate substantially equal to that in Example 11 described above. Observation of the surface of the copper by an SEM revealed that it is formed with such fine acicular projections as shown in FIG. 23, resulting in the surface being satisfactorily roughened.

TABLE 18

| Liquid Etchant of Example 18 (Temperature: 30° C.) | |
| --- | --- |
| $H_2O_2$ | 34 g/l |
| $H_2SO_4$ | 80 g/l |
| $H_3PO_4$ | 20 g/l |
| 5-Mercaptotriazole | 1.5 g/l |
| Tolyltriazole | 6 g/l |

EXAMPLE 19

Figure 24:
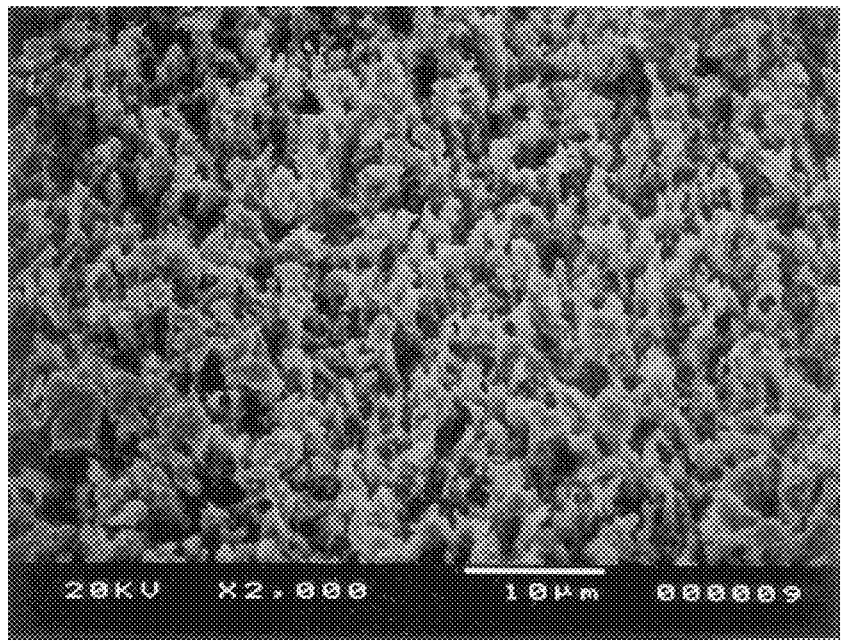

A copper-clad laminate made of epoxy resin filled with a glass fabric was dipped for one minute in a liquid etchant shown in Table 19 in substantially the same manner as in Examples described above, so that a copper surface of the copper-clad laminate was roughened. The liquid etchant of Example 19 exhibits an etching rate substantially one half as high as that in Example 11 described above. Observation of the surface of the copper by an SEM revealed that it is formed with such fine to acicular projections as shown in FIG. 24, resulting in the surface thereof being satisfactorily roughened.

TABLE 19

| Liquid Etchant of Example 19 (Temperature: 30° C.) | |
| --- | --- |
| $H_2O_2$ | 34 g/l |
| $H_2SO_4$ | 80 g/l |
| $H_3PO_4$ | 20 g/l |
| Triazole | 3 g/l |
| 5-Methyltetrazole | 6 g/l |

EXAMPLE 20

Figure 25:
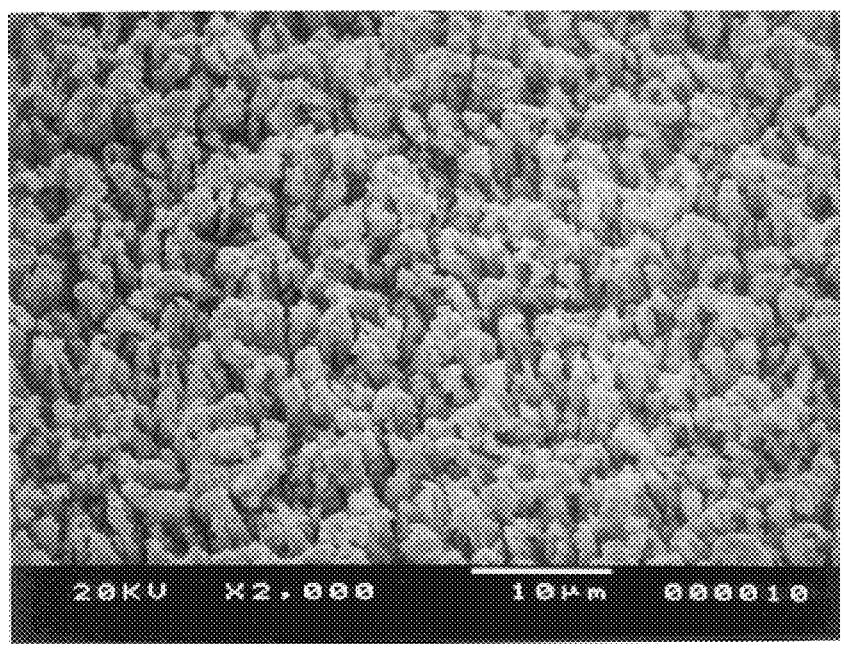

A copper-clad laminate made of epoxy resin filled with a glass fabric was dipped for one minute in a liquid etchant shown in Table 20 in substantially the same manner as in Examples described above, so that a copper surface of the copper-clad laminate was roughened. The liquid etchant of Example 20 exhibits an etching rate substantially equal to that in Example 11 described above. Observation of the surface of the copper by an SEM revealed that it is formed with such fine acicular projections as shown in FIG. 25, resulting in the surface being satisfactorily roughened.

TABLE 20

| Liquid Etchant of Example 20 (Temperature: 30° C.) | |
| --- | --- |
| $H_2O_2$ | 34 g/l |
| $H_2SO_4$ | 80 g/l |
| $H_3PO_4$ | 20 g/l |
| 5-Mercaptotriazole | 3 g/l |
| 5-Methyltetrazole | 6 g/l |

EXAMPLE 21

Figure 26:
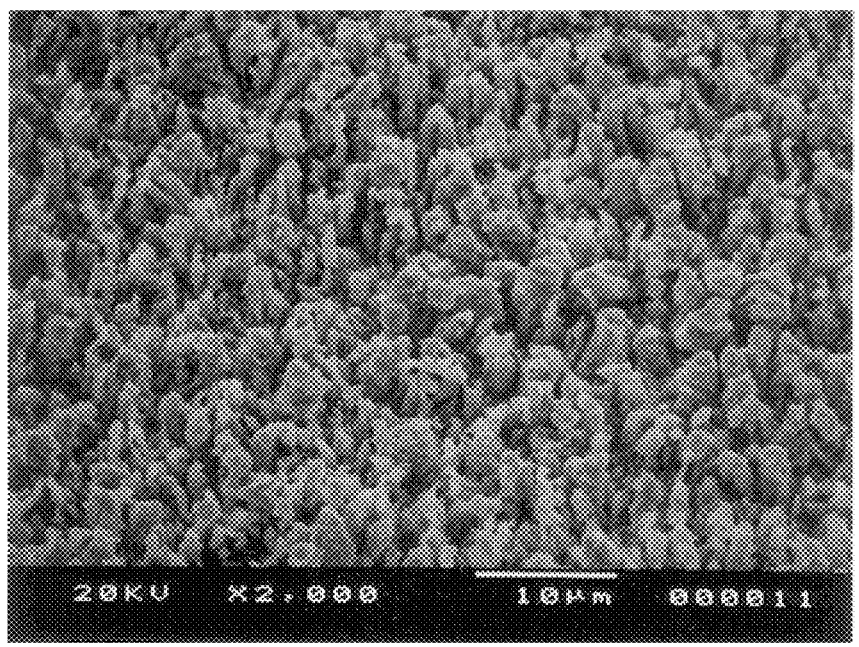

A copper-clad laminate made of epoxy resin filled with a glass fabric was dipped for one minute in a liquid etchant shown in Table 21 in substantially the same manner as in Examples described above, so that a copper surface of the copper-clad laminate was roughened. The liquid etchant of Example 21 had sodium fluoride added thereto as the halogen. The liquid etchant exhibits an etching rate substantially equal to that in Example 11 described above. Observation of the surface of the copper by an SEM revealed that it is formed with such fine acicular projections as shown in FIG. 26, resulting in the surface being satisfactorily roughened.

TABLE 21

| Liquid Etchant of Example 21 (Temperature: 30° C.) | |
| --- | --- |
| $H_2O_2$ | 34 g/l |
| $H_2SO_4$ | 80 g/l |
| $H_3PO_4$ | 20 g/l |
| 5-Aminotetrazole | 3 g/l |
| Benzotriazole | 6 g/l |
| Sodium fluoride (F) | 4.4 (2) g/l |

EXAMPLE 22

Figure 27:
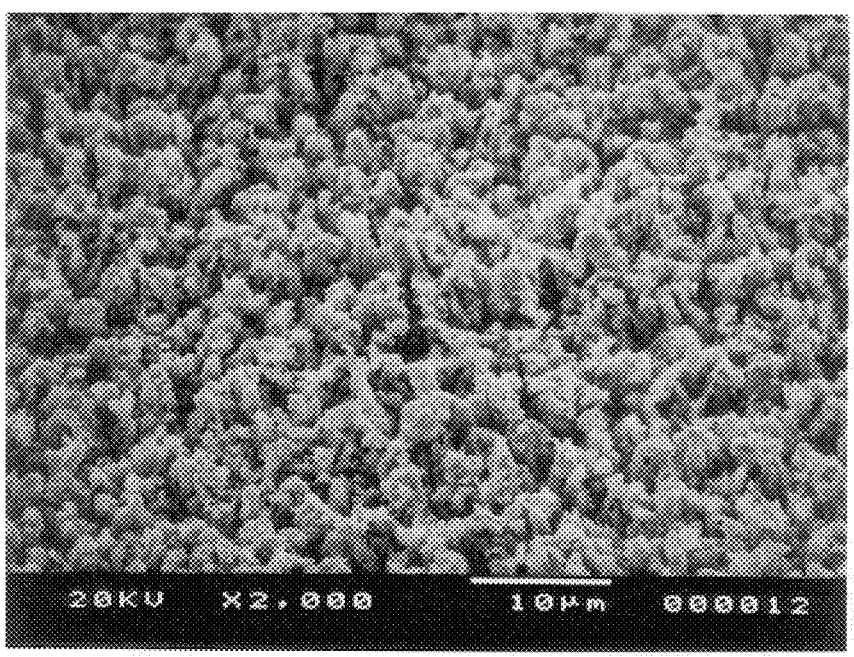

A copper-clad laminate made of epoxy resin filled with a glass fabric was dipped for one minute in a liquid etchant shown in Table 22 in substantially the same manner as in Examples described above, so that a copper surface of the copper-clad laminate was roughened. The liquid etchant of Example 22 had sodium chloride added thereto as the halogen. The liquid etchant exhibits an etching rate substantially equal to that in Example 11 described above. Observation of the surface of the copper by an SEM revealed that it is formed with such fine acicular projections as shown in FIG. 27, resulting in the surface thereof being satisfactorily roughened.

TABLE 22

| Liquid Etchant of Example 22 (Temperature: 30° C.) | |
| --- | --- |
| $H_2O_2$ | 34 g/l |
| $H_2SO_4$ | 80 g/l |
| $H_3PO_4$ | 20 g/l |
| 5-Methyltetrazole | 3 g/l |
| Benzotriazole | 6 g/l |
| Sodium chloride (Cl) | 16 (10) mg/l |

EXAMPLE 23

Figure 28:
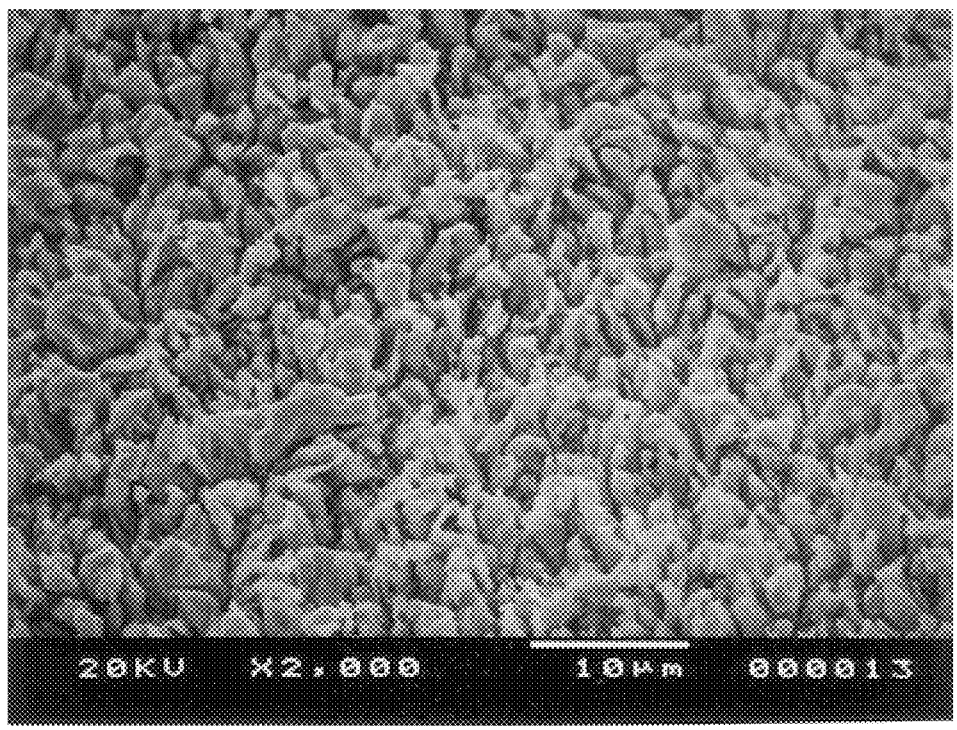

A copper-clad laminate made of epoxy resin filled with a glass fabric was dipped for one minute in a liquid etchant shown in Table 23 in substantially the same manner as in Examples described above, so that a copper surface of the copper-clad laminate was roughened. The liquid etchant of Example 23 had sodium bromide added thereto as the halogen. The liquid etchant exhibits an etching rate substantially equal to that in Example 11 described above. Observation of the surface of the copper by an SEM revealed that it is formed with such fine acicular projections as shown in FIG. 28, resulting in the surface thereof being satisfactorily roughened.

TABLE 23

| Liquid Etchant of Example 23 (Temperature: 30° C.) | |
| --- | --- |
| $H_2O_2$ | 34 g/l |
| $H_2SO_4$ | 80 g/l |
| $H_3PO_4$ | 20 g/l |

TABLE 23-continued

Liquid Etchant of Example 23 (Temperature: 30° C.)

| | |
|---|---|
| 5-Aminotetrazole | 3 g/l |
| Tolyltriazole | 6 g/l |
| Sodium bromide (Br) | 0.03 (0.02) g/l |

COMPARATIVE EXAMPLE

The conventional liquid etchant described above was prepared into such a composition as shown in Table 24. Then, a copper-clad laminate made of epoxy resin filled with a glass fabric was dipped for three minutes and five minutes in the liquid etchant shown in Table 24, so that a copper surface of the copper-clad laminate was roughened.

TABLE 24

Liquid Etchant of Comparative Example (Temperature: 30° C.)

| | |
|---|---|
| $H_2O_2$ | 80 g/l |
| $H_2SO_4$ | 90 g/l |
| Benzotriazole | 6 g/l |
| Sodium chloride (Cl) | 200 (120) mg/l |

It was revealed that the copper-clad laminate of each of Examples 1 to 23 and Comparative Example does not cause discoloration of the roughened surface or dissolution thereof in spite of dipping thereof in hydrochloric acid (1:1) after it was subjected to roughening of the surface thereof. However, dipping of the copper-clad laminate in the liquid etchant in Comparative Example for three minutes failed in satisfactory roughening of the surface thereof and required a dipping time as long as 5 minutes in order to permit the surface thereof to be roughened to substantially the same degree as in each of Examples according to the present invention. On the contrary, Examples according to the present invention each permit a time required for satisfactory etching to be reduced to a level from about one half to about one fifth as long as that required in Comparative Example. Also, the amount of hydrogen peroxide used in Examples according to the invention is one half as large as that in Comparative Example, thus, it should be understood that Examples according to the invention can actually reduce the time to a level from about one quarter to about one tenth as long as that required in Comparative Example.

While the present invention has been described with a certain degree of particularity with reference to the drawings and examples, obvious modifications and variations are possible in light of the above teachings. It is therefore to be understood that within the scope of the appended claims, the invention may be practiced otherwise than as specifically described.

What is claimed is:

1. A liquid etchant adapted for use to acicularly roughen a surface of copper consisting essentially of:
    a main component containing at least one acid selected from the group consisting of oxo acids represented by one of the following chemical formulae:

$XO_m(OH)_n$ and $H_nXO_{(m+n)}$ wherein X is a central atom, m is an integer of 0 or more, and n is an integer of 1 or more and derivatives thereof and at least one compound selected from the group consisting of peroxides and derivatives thereof; and
        an auxiliary component containing at least one tetrazole and a second azole selected from the group consisting of a benzotriazole and a tolyltriazole.

2. A liquid etchant as defined in claim 1, wherein said auxiliary component contains at least one halide selected from the group consisting of chlorides, fluorides and bromides.

3. A liquid etchant as defined in claim 2, wherein said at least one halide is a chloride which is contained in the liquid etchant so that a chlorine ion concentration is 50 mg/l or less.

4. A liquid etchant as defined in claim 2, wherein said at least one halide is a fluoride which is contained in the liquid etchant so that a fluorine ion concentration is 50 g/l or less.

5. A liquid etchant as defined in claim 2, wherein said at least one halide is a bromide which is contained in the liquid etchant so that a bromine ion concentration is 0.1 g/l or less.

6. A liquid etchant as defined in claim 1, wherein said m in said chemical formulae representing said oxo acids is 2 or more.

7. A liquid etchant as defined in claim 1, wherein said (m+n) in said chemical formulae representing said oxo acids is 4 or more.

8. A liquid etchant as defined in claim 1, wherein said tetrazole is selected from the group consisting of 1 H-tetrazole and derivatives thereof.

9. A liquid etchant as defined in claim 8, wherein said second azole comprises a triazole.

10. A liquid etchant adapted for use to acicularly roughen a surface of copper consisting essentially of:
    a main component containing at least one acid selected from the group consisting of oxo acids represented by one of the following chemical formulae:

$XO_m(OH)_n$ and $H_nXO_{(m+n)}$ wherein X is a central atom, m is an integer of 0 or more, and n is an integer of 1 or more and derivatives thereof and at least one compound selected from the group consisting of peroxides and derivatives thereof; and
        an auxiliary component containing at least one azole selected from the group consisting of 1,2,3-azoles which have three or more nitrogen atoms arranged in succession in a five-membered N-heterocycle thereof and a second azole selected from the group consisting of a benzotriazole and a tolyltriazole.

11. A liquid etchant as defined in claim 10, wherein the 1,2,3-azoles are represented by one of the following chemical formulae:

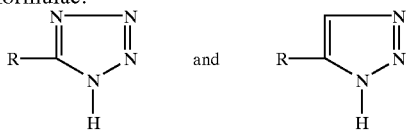

wherein R is selected from the group consisting of hydrogen, methyl, amino, carboxyl and mercapto radicals.

12. A liquid etchant as defined in claim 10, wherein said auxiliary component contains at least one halide selected from the group consisting of chlorides, fluorides and bromides.

13. A liquid etchant as defined in claim 12, wherein said at least one halide is a chloride which is contained in the liquid etchant so that a chlorine ion concentration is 50 mg/l or less.

14. A liquid etchant as defined in claim 12, wherein said at least one halide is a fluoride which is contained in the liquid etchant so that a fluorine ion concentration is 50 g/l or less.

15. A liquid etchant as defined in claim 12, wherein said at least one halide is a bromide which is contained in the liquid etchant so that a bromine ion concentration is 0.1 g/l or less.

16. A liquid etchant as defined in claim 10, wherein said m in said chemical formulae representing said oxo acids is 2 or more.

17. A liquid etchant as defined in claim 10, wherein said (m+n) in said chemical formulae representing said oxo acids is 4 or more.

18. A liquid etchant as defined in claim 10, wherein said 1,2,3-azole is selected from the group consisting of 1 H-tetrazole, 1 H-triazole, 5-amino-1 H-tetrazole, 5-methyl-1 H-tetrazole, 5-amino-1 H-triazole, 5-mercapto-1 H-triazole, 5-methyl-1 H-triazole, and derivatives thereof.

19. A liquid etchant as defined in claim 18, wherein said second azole comprises a triazole.

20. A liquid etchant comprising:
a main component containing at least one acid selected from the group consisting of oxo acids represented by one of the following chemical formulae:

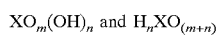
$XO_m(OH)_n$ and $H_nXO_{(m+n)}$ wherein X is a central atom, m is an integer of 0 or more, and n is an integer of 1 or more and derivatives thereof and at least one compound selected from the group consisting of peroxides and derivatives thereof; and
an auxiliary component containing at least one tetrazole and a second azole selected from the group consisting of a benzotriazole and a tolyltriazole.

21. A liquid etchant as claimed in claim 20 wherein said auxiliary component contains at least one halide selected from the group consisting of chlorides, fluorides and bromides.

22. A liquid etchant as defined in claim 21 wherein at least one halide is contained in the liquid etchant so that a halide ion concentration is 50 mg/l or less.

23. A liquid etchant as defined in claim 20 wherein said tetrazole is selected from the group consisting of 1 H-tetrazole, 5-amino tetrazole, 5-amino tetrazole, and 5-methyl tetrazole.

24. A liquid etchant comprising:
a main component containing at least one acid selected from the group consisting of oxo acids represented by one of the following chemical formulae:

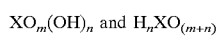
$XO_m(OH)_n$ and $H_nXO_{(m+n)}$ wherein X is a central atom, m is an integer of 0 or more, and n is an integer of 1 or more and derivatives thereof and at least one compound selected from the group consisting of peroxides and derivatives thereof; and
an auxiliary component containing at least one azole selected from the group consisting of 1,2,3-azoles which have three or more nitrogen atoms arranged in succession in a five-membered N-heterocycle thereof, and a second azole selected from the group consisting of a benzotriazole and a tolyltriazole.

25. A liquid etchant as defined in claim 24 wherein the 1,2,3-azoles are represented by one of the following chemical formulae:

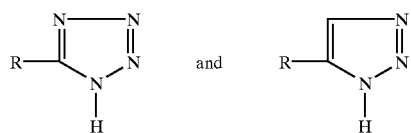

wherein R is selected from the group consisting of hydrogen, methyl, amino, carboxyl and mercapto radicals.

26. A liquid etchant as defined in claim 24 wherein said auxiliary component contains at least one halide selected from the group consisting of chlorides, fluorides and bromides.

27. A liquid etchant as claimed in claim 26 wherein said at least one halide is contained in a liquid etchant so that a halide ion concentration is 15 mg/l or less.

28. A liquid etchant as claimed in claim 24 wherein said 1,2,3-azole is selected from the group consisting of 1 H-tetrazole, 5-amino-1 H-tetrazole, 5-methyl-1 H-tetrazole, 1 H-triazole, 5-amino-1 H-triazole, 5-mercapto-1 H-triazole, 5-methyl-1 H-triazole, and derivatives thereof.

* * * * *

UNITED STATES PATENT AND TRADEMARK OFFICE
CERTIFICATE OF CORRECTION

PATENT NO.   : 6,666,987 B1  Page 1 of 1
DATED        : December 23, 2003
INVENTOR(S)  : Yoshihiko Morikawa, Kazunori Senbiki and Nobuhiro Yamazaki It is certified that error appears in the above-identified patent and that said Letters Patent is hereby corrected as shown below:

<u>Column 1,</u>
Line 7, after "for" insert -- roughening a copper surface, and more particularly to a liquid --
Line 13, delete "raw".

Signed and Sealed this

Fourth Day of May, 2004

JON W. DUDAS
*Acting Director of the United States Patent and Trademark Office*